(12) United States Patent
Jung et al.

(10) Patent No.: US 9,368,694 B2
(45) Date of Patent: Jun. 14, 2016

(54) METHOD OF FABRICATING LIGHT-EMITTING DEVICE PACKAGE

(71) Applicant: SAMSUNG ELECTRONICS CO., LTD., Suwon-si, Gyeonggi-do (KR)

(72) Inventors: Raphael Jung, Yongin-si (KR); Jae-hyung Im, Seoul (KR); Young-sun Kwak, Seoul (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/741,192

(22) Filed: Jun. 16, 2015

(65) Prior Publication Data

US 2016/0099388 A1 Apr. 7, 2016

(30) Foreign Application Priority Data

Oct. 6, 2014 (KR) ........................ 10-2014-0134475

(51) Int. Cl.
| | |
|---|---|
| H01L 21/66 | (2006.01) |
| G01R 31/26 | (2014.01) |
| H01L 33/50 | (2010.01) |
| H01L 33/54 | (2010.01) |
| H01L 33/58 | (2010.01) |
| G01B 11/06 | (2006.01) |

(52) U.S. Cl.
CPC .............. *H01L 33/502* (2013.01); *H01L 22/24* (2013.01); *H01L 33/54* (2013.01); *H01L 33/58* (2013.01); *G01B 11/0658* (2013.01); *H01L 2933/005* (2013.01); *H01L 2933/0041* (2013.01); *H01L 2933/0058* (2013.01)

(58) Field of Classification Search
None
See application file for complete search history.

(56) References Cited

U.S. PATENT DOCUMENTS

| | | |
|---|---|---|
| 6,252,237 B1 | 6/2001 | Ramthun et al. |
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 6,992,781 B2 | 1/2006 | Okada et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,708,613 B2 | 5/2010 | Taguchi et al. |

(Continued)

FOREIGN PATENT DOCUMENTS

| | | |
|---|---|---|
| JP | 2004-012419 A | 1/2004 |
| KR | 10-2006-0115452 A | 11/2006 |
| KR | 10-2013-0125146 A | 11/2013 |

*Primary Examiner* — Angel Roman
(74) *Attorney, Agent, or Firm* — Muir Patent Law, PLLC

(57) ABSTRACT

A method of fabricating a light-emitting device package includes preparing a carrier including a first surface and a second surface disposed opposite the first surface, forming a phosphor layer on the first surface of the carrier, emitting first light from a test light-emitting device toward the second surface of the carrier, analyzing second light passing through the phosphor layer, and determining a thickness of the phosphor layer based on the analysis.

20 Claims, 15 Drawing Sheets

(56) References Cited

U.S. PATENT DOCUMENTS

| | | |
|---|---|---|
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,858,409 B2 | 12/2010 | Kessels et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2007/0243313 A1* | 10/2007 | Hasegawa ............ C23C 14/0694 427/8 |
| 2011/0300644 A1* | 12/2011 | Akimoto ............... H01L 33/508 438/7 |
| 2013/0168717 A1 | 7/2013 | Kono et al. |

\* cited by examiner

FIG. 12

| PURPOSE | PHOSPHOR |
|---|---|
| LED TV BLU | $\beta$-SiAlON:$Eu^{2+}$, (Ca, Sr)AlSiN$_3$:$Eu^{2+}$, La$_3$Si$_6$N$_{11}$:$Ce^{3+}$, $K_2SiF_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5≤x≤3, 0<z<0.3, 0<y≤4), $K_2TiF_6$:$Mn^{4+}$, NaYF$_4$:$Mn^{4+}$, NaGdF$_4$:$Mn^{4+}$, Ca$_2$SiO$_4$:$Eu^{2+}$, Ca$_{1.2}$Eu$_{0.8}$SiO$_4$ |
| ILLUMINATION | Lu$_3$Al$_5$O$_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, $K_2SiF_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5≤x≤3, 0<z<0.3, 0<y≤4), $K_2TiF_6$:$Mn^{4+}$, NaYF$_4$:$Mn^{4+}$, NaGdF$_4$:$Mn^{4+}$, Ca$_2$SiO$_4$:$Eu^{2+}$, Ca$_{1.2}$Eu$_{0.8}$SiO$_4$ |
| Side view (Mobile, Note PC) | Lu$_3$Al$_5$O$_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, (Sr, Ba, Ca, Mg)$_2$SiO$_4$:$Eu^{2+}$, $K_2SiF_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5≤x≤3, 0<z<0.3, 0<y≤4), $K_2TiF_6$:$Mn^{4+}$, NaYF$_4$:$Mn^{4+}$, NaGdF$_4$:$Mn^{4+}$, Ca$_2$SiO$_4$:$Eu^{2+}$, Ca$_{1.2}$Eu$_{0.8}$SiO$_4$ |
| AUTOMOTIVE ELECRTONICS (Head Lamp etc.) | Lu$_3$Al$_5$O$_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, $K_2SiF_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5≤x≤3, 0<z<0.3, 0<y≤4), $K_2TiF_6$:$Mn^{4+}$, NaYF$_4$:$Mn^{4+}$, NaGdF$_4$:$Mn^{4+}$, Ca$_2$SiO$_4$:$Eu^{2+}$, Ca$_{1.2}$Eu$_{0.8}$SiO$_4$ |

3000

METHOD OF FABRICATING LIGHT-EMITTING DEVICE PACKAGE

CROSS-REFERENCE TO RELATED APPLICATION

This application claims the benefit of Korean Patent Application No. 10-2014-0134475, filed on Oct. 6, 2014, in the Korean Intellectual Property Office, the disclosure of which is incorporated herein in its entirety by reference.

BACKGROUND

The inventive concept relates to a light-emitting device package and a method of fabricating the same, and more particularly, to a method of fabricating a light-emitting device package having a phosphor layer.

A white light-emitting diode (white LED) device has attracted much attention in various technical fields, such as computers, cellphones, and projectors. In particular, the white LED device is being applied in an increasing broad range of fields, such as backlight units (BLUs) of liquid crystal displays (LCDs) and illumination systems. The white LED device may be embodied by using a blue LED chip and a phosphor layer, and there is lately an increasing demand for a technique for efficiently forming the phosphor layer.

SUMMARY

The inventive concept provides a method of fabricating a light-emitting device package, by which a phosphor layer may be efficiently formed.

According to an aspect of the inventive concept, there is provided a method of fabricating a light-emitting device package. The method may include preparing a carrier including a first surface and a second surface disposed opposite the first surface, forming a phosphor layer on the first surface of the carrier, emitting first light from a test light-emitting device toward the second surface of the carrier, and analyzing second light included in the first light and passing through the phosphor layer and determining a thickness of the phosphor layer based on the analysis.

The formation of the phosphor layer may include coating the first surface of the carrier with phosphor, and shaping the phosphor using a mold. The mold may include at least one of a blade and a roller.

The second light may include first transmitted light having a wavelength range substantially the same as a wavelength range of the first light and second transmitted light having a wavelength range different from the wavelength range of the first light. The determination of the thickness of the phosphor layer may include calculating a ratio of luminous intensity of the second transmitted light to luminous intensity of the first transmitted light.

The first light emitted by the test light-emitting device may include blue light. The second light emitted by the phosphor layer may include blue light and yellow light.

The determination of the thickness of the phosphor layer may include collecting a luminous intensity spectrum with respect to the wavelength of the second light, and calculating a ratio of a maximum luminous intensity of the yellow light to a maximum luminous intensity of the blue light in the luminous intensity spectrum.

The thickness of the phosphor layer may be represented by an equation:

$$d = a1 * \ln\frac{Iy}{Ib} + b1,$$

wherein d is the thickness of the phosphor layer, Iy is the maximum luminous intensity of the yellow light, Ib is the maximum luminous intensity of the blue light, and each of a1 and b1 is a constant.

The determination of the thickness of the phosphor layer may include collecting a luminous intensity spectrum relative to the wavelength of the second light, and calculating a ratio of a total amount of light in a wavelength range of yellow light to a total amount of light in a wavelength range of blue light. The thickness of the phosphor layer may be represented by an equation:

$$d = a2 * \ln\frac{Iyt}{Ibt} + b2,$$

wherein d is the thickness of the phosphor layer, Iyt is the total amount of light in a wavelength range of the yellow light, Ibt is the total amount of light in a wavelength range of the blue light, and each of a2 and b2 is a constant.

According to another aspect of the inventive concept, there is provided a method of fabricating a light-emitting device package. The method includes coating a first surface of a carrier with phosphor, forming a phosphor layer by shaping the phosphor using a mold, measuring a thickness of the phosphor layer in real-time using a test light-emitting device and a photodetector, determining whether the measured thickness of the phosphor layer is equal to a desired thickness, and controlling the thickness of the phosphor layer by adjusting the mold, according to the determination.

The controlling of the thickness of the phosphor layer may include adjusting a height of the mold with reference to the first surface of the carrier.

The test light-emitting device may face a second surface disposed opposite the first surface of the carrier, and the photodetector may face the first surface of the carrier.

The photodetector may detect light that is continuously emitted by the phosphor layer during the formation of the phosphor layer.

The photodetector may detect light emitted by the phosphor layer, only for a specific time period during the formation of the phosphor layer.

According to another aspect of the inventive concept, there is provided a method of fabricating a light-emitting device package. The method may include coating a carrier with phosphor, forming a phosphor layer by shaping the phosphor using a mold, determining a thickness of the phosphor layer in real-time using a test light-emitting device and a photodetector, adjusting the mold in real-time, based on the determined thickness of the phosphor layer, until the determined thickness is equal to a desired thickness, and dividing the phosphor layer using a sawing process into discrete phosphor layers.

The method may further include preparing a light-emitting chip, and attaching the discrete phosphor layers to the light-emitting chip using a pickup tool.

Before dividing the phosphor layer using the sawing process, the method may further include attaching a plurality of light-emitting chips onto the phosphor layer. The division of the phosphor layer using the sawing process may be performed on the phosphor layer to which the plurality of light-emitting chips are attached.

The test light-emitting device may be a blue light-emitting diode (LED), and the phosphor may be yellow phosphor.

The test light-emitting device may emit light of a predetermined spectrum during the formation of the phosphor layer.

According to still another aspect of the inventive concept, there is provided a method of fabricating a light-emitting device package. The method may include steps of coating a first surface of a carrier with phosphor, moving one of a blade and the carrier with reference to another, along a direction parallel to the first surface so as to form a phosphor layer on the carrier, providing a test light-emitting device at a first side of the carrier and the phosphor layer so as to emit first light to the phosphor layer, and a photodetector positioned at a second side of the carrier and the phosphor layer opposite to the first side so as to collect second light originated from the test light-emitting device and converted by the phosphor layer, analyzing spectrum of the second light collected by the photodetector, and adjusting a distance between the blade and the first surface based on the analysis of spectrum.

The second light may include first transmitted light having a wavelength range substantially the same as a wavelength range of the first light and second transmitted light having a wavelength range different from the wavelength range of the first light. The step of analyzing the second light comprises one selected from the group consisting of determining a ratio of luminous intensity of the second transmitted light to luminous intensity of the first transmitted light, determining a ratio of a maximum luminous intensity of the second transmitted light to a maximum luminous intensity of the first transmitted light, and determining a ratio of a total amount of light in a wavelength range of the second transmitted light to a total amount of light in a wavelength range of the first transmitted light.

The step of adjusting the distance may include if the determined ratio is greater than an upper limit of a corresponding predetermined range, decreasing the distance between the blade and the first surface, if the determined ratio is less than a lower limit of the corresponding predetermined range, increasing the distance between the blade and the first surface, and if the determined ratio is within the corresponding predetermined range, maintaining the distance between the blade and the first surface.

The method may further include attaching the phosphor layer to a plurality of light-emitting devices each emitting substantially the same light as the test light-emitting device, and singulating the phosphor layer so as to form a plurality of light-emitting device packages.

The method may further include singulating the phosphor layer so as to form a plurality of singulated phosphor layers, and attaching one of the plurality of singulated phosphor layers to a light-emitting device emitting substantially the same light as the test light-emitting device.

BRIEF DESCRIPTION OF THE DRAWINGS

Exemplary embodiments of the inventive concept will be more clearly understood from the following detailed description taken in conjunction with the accompanying drawings in which:

FIG. 12 is a table showing types of phosphors used within application fields of a white light-emitting device package using a blue light-emitting device according to exemplary embodiments of the inventive concept;

DETAILED DESCRIPTION OF THE EMBODIMENTS

Figure 1:
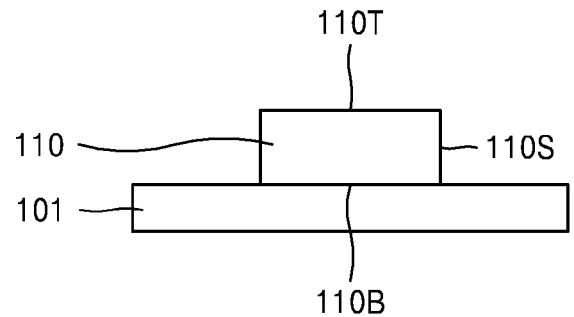
FIG. 1 is a cross-sectional view of a process of mounting a light-emitting device on a substrate in a method of fabricating a light-emitting device package according to an exemplary embodiment of the inventive concept.

The inventive concept will be described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the sizes of layers and regions may be exaggerated for clarity. The same reference numerals are used to denote the same elements, and repeated descriptions thereof will be omitted.

It will be understood that, although the terms "first," "second," etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless explicitly so defined herein.

When some embodiments may be embodied otherwise, respective process steps described herein may be performed otherwise. For example, two process steps described in a sequential order may be performed substantially the same time or in reverse order.

Variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing.

As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view of a process of mounting a light-emitting device 110 on a substrate 101 in a method of fabricating a light-emitting device package according to an exemplary embodiment of the inventive concept.

Referring to FIG. 1, the substrate 101 for mounting the light-emitting device 110 may be prepared, and the light-emitting device 110 may be mounted on the substrate 101.

The substrate 101 may be any substrate having an interconnection structure for driving the light-emitting device 110, which is not limited in structures or types.

In some exemplary embodiments, the substrate 101 may be previously divided into a plurality of portions, and at least one light-emitting device 110 may be mounted on each of the portions of the substrate 101.

In some other embodiments, a plurality of light-emitting devices 110 may be mounted on the substrate 101, and then the substrate 101 may be divided into a plurality of portions corresponding to locations where the respective light-emitting devices 110 are mounted on the substrate 101.

In some other embodiments, a plurality of light-emitting devices 110 may be mounted on one substrate 101.

The present embodiment illustrates an example in which the substrate 101 may be previously divided into a plurality of portions, and one light-emitting device 110 may be mounted on each of the portions of the substrate 101.

In some exemplary embodiments, the light-emitting device 110 may be a light emitting diode (LED) chip, which may be electrically connected to the substrate 101 through a bottom surface 110B of the LED chip and emit light to at least one of a top surface 110T and a side surface 110S of the LED chip.

The light-emitting device 110 may be fabricated using a nitride semiconductor, such as aluminum indium gallium nitride (AlInGaN). For example, the light-emitting device 110 may include an active layer (not shown) configured to generate light, an n-type nitride layer (not shown) formed under or on the active layer and configured to supply electrons to the active layer, and a p-type nitride layer (not shown) stacked on or under the active layer opposite the n-type nitride layer and configured to supply holes to the active layer. Although not shown, electrodes (not shown) for creating electric connections to the substrate 101 may be formed on the bottom surface 110B of the light-emitting device 110. An exemplary structure of the light-emitting device 110 will be described in detail later with reference to FIGS. 8 and 9.

The light-emitting device 110 may be, for example, an LED chip configured to emit ultraviolet (UV) light having a wavelength range of about 100 nm to about 430 nm, blue light having a wavelength range of about 430 nm to about 480 nm, green light having a wavelength range of about 500 nm to about 560 nm, or red light having a wavelength range of about 610 nm to about 670 nm.

Figure 2:
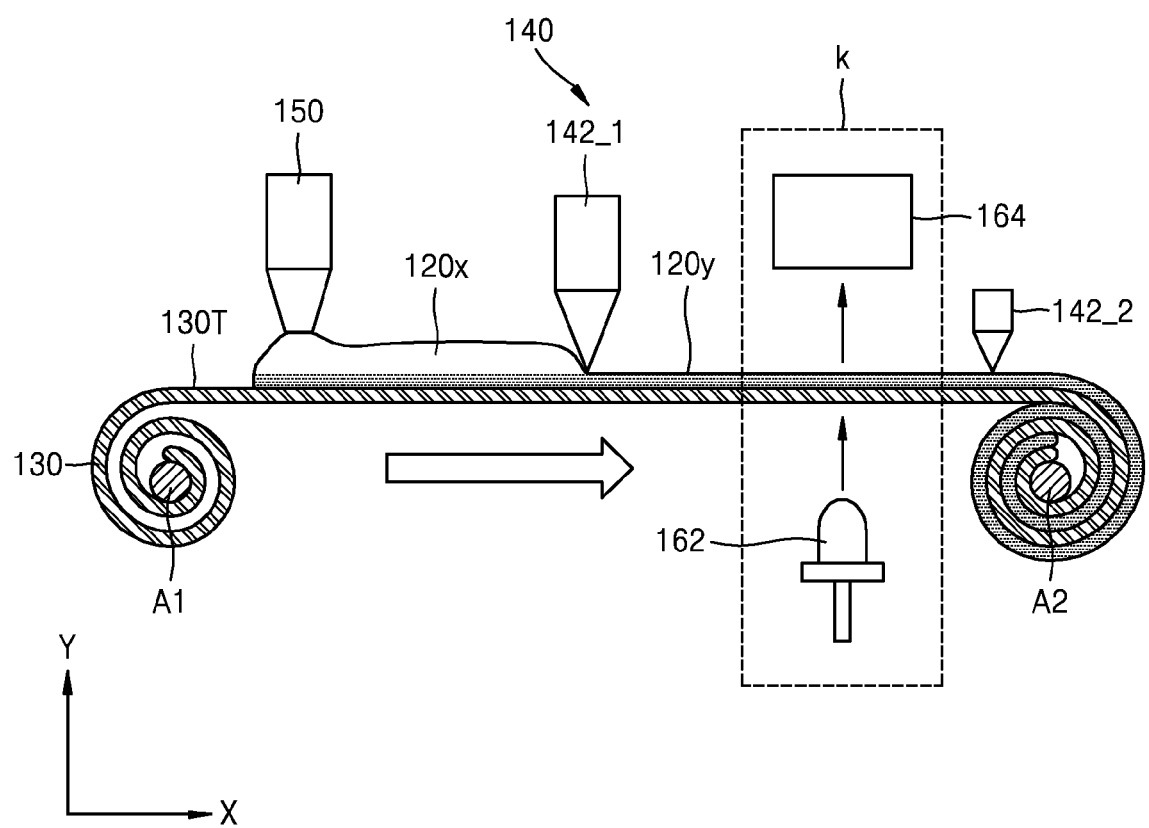
FIG. 2 is a cross-sectional view of a process of forming a phosphor layer in a method of fabricating a light-emitting device package according to an exemplary embodiment of the inventive concept.

FIG. 2 is a cross-sectional view of a process of forming a phosphor layer 120y in a method of fabricating a light-emitting device package according to an exemplary embodiment of the inventive concept.

Referring to FIG. 2, while a carrier 130 is being conveyed from a first axis A1 to a second axis A2 in a first direction (x-axial direction), the phosphor layer 120y may be formed on one surface 130T of the carrier 130.

The carrier 130 may have any structure or be of any type as long as light emitted by a test light-emitting device 162 may pass through the carrier 130 without distortion. For example, the carrier 130 may be an ultrathin transparent plastic film or a thin glass. The carrier 130 may have flexibility and penetrability. The test light-emitting device 162 may emit substantially the same light as the light-emitting device 110 to be packaged by using the phosphor layer 120y.

In some embodiments, the carrier 130 may be wounded around the first axis A1 in a ready state, and then wound around the second axis A2 along with the phosphor layer 120y after a process of forming the phosphor 120y is completed.

A phosphor supplying unit 150 may be configured to form a layer using phosphor 120x on the one surface 130T of the carrier 130 during movement of the carrier 130 from the first axis A1 to the second axis A2. Although the present embodiment illustrates an example in which any other layer is not provided between the phosphor 120x and the carrier 130, the inventive concepts is not limited thereto. For example, a silicone layer or an adhesive layer may be further formed between the phosphor 120x and the carrier 130.

The phosphor 120x may convert light to be emitted by the light-emitting device (refer to 110 in FIG. 1) into white light. To this end, a composition of the phosphor 120x may vary according to color (i.e., wavelength) of light to be emitted by the light-emitting device 110.

In some embodiments, the light-emitting device 110 may be a blue LED chip configured to emit blue light having a wavelength range of about 430 nm to about 480 nm, and the phosphor 120*x* may be a yellow phosphor. The yellow phosphor may include, for example, a YAG-based material containing a rare-earth element (e.g., cerium (Ce)-doped $(YGd)_5Al_5O_3$) or a silicate-based material (e.g., europium (Eu)-doped strontium silicon oxide $(Sr_3SiO_5)$).

In some other embodiments, the light-emitting device 110 may be a green LED chip configured to emit green light having a wavelength range of about 500 nm to about 560 nm, and the phosphor 120*x* may be a red phosphor. The red phosphor may include, for example, a nitride-based material containing a rare-earth element (e.g., Eu-doped $SrBaCaAlSiN_3$), an oxide-based material (e.g., Eu-doped yttrium oxide $(Y_2O_3)$), or a sulfide-based material (e.g., Eu-doped calcium sulfide (CaS)).

The phosphor layer 120*y* may be formed by shaping the phosphor 120*x* using a mold 140.

In some embodiments, the mold 140 may include a first blade 142_1 and a second blade 142_2. The present embodiment illustrates an example in which the mold 140 includes two blades 142_1 and 142_2, but the mold 140 may include one blade or three or more blades.

Figure 3:
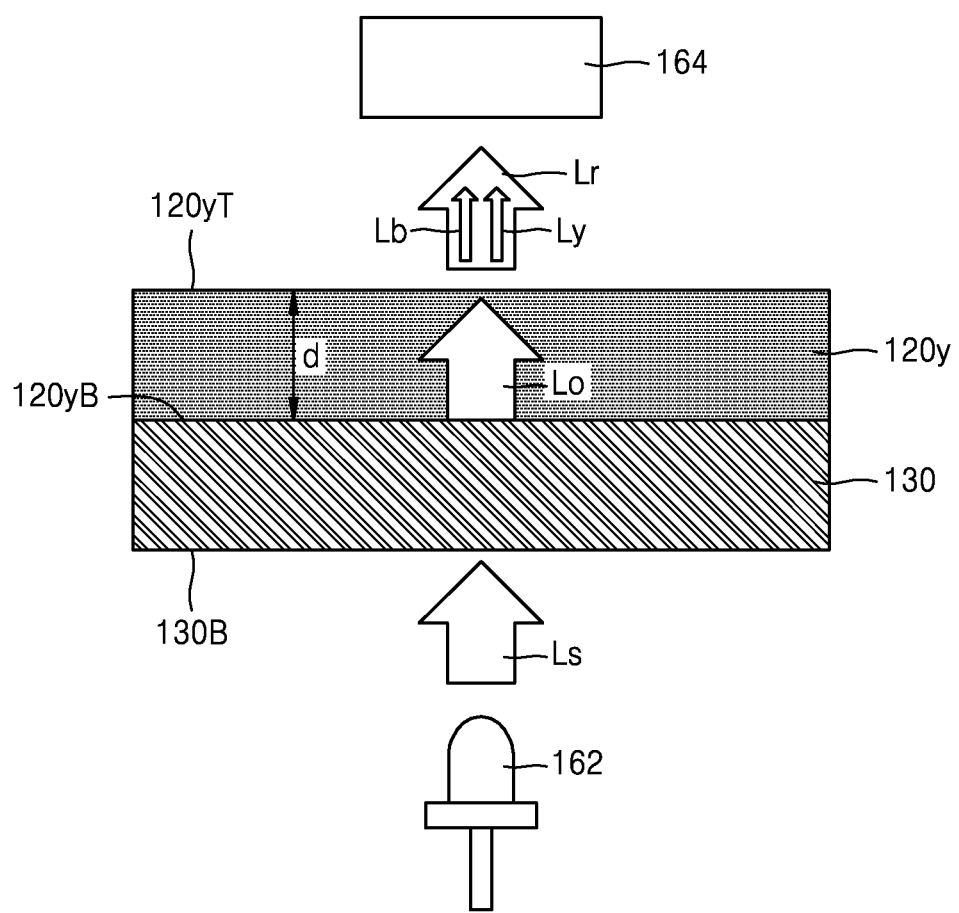
FIG. 3 is a partial enlarged view of a region K of FIG. 2, illustrating a method of measuring a thickness of the phosphor layer.

The first and second blades 142_1 and 142_2 may shape the phosphor 120*x* formed on the surface 130T of the carrier 130 and form the phosphor layer 120*y* having a uniform thickness (refer to "d" in FIG. 3).

A height of at least one of the first and second blades 142_1 and 142_2 that is obtained in a second direction (Y-axial direction) may be adjusted. The height of the first and second blades 142_1 and 142_2 may refer to a distance from the first and second blades 142_1 and 142_2 to the one surface 130T. The thickness "d" of the phosphor layer 120*y* may be adjusted by adjusting the height of the first and second blades 142_1 and 142_2.

In some embodiments, after a thickness of the phosphor layer 120*y* formed by the first blade 142_1 is measured using the test light-emitting device 162 and a photodetector 164, the thickness of the phosphor layer 120*y* may be controlled by adjusting the height of the second blade 142_2 that is obtained in the second direction (Y-axial direction).

In some embodiments, at least one of the first and second blades 142_1 and 142_2 may have various shapes and form a patterned phosphor layer 120*y*.

During the formation of the phosphor layer 120*y*, the thickness of the phosphor layer 120*y* may be measured by using the test light-emitting device 162 and the photodetector 164.

Furthermore, to form the phosphor layer 120*y* to a desired thickness, the height of at least one of the first and second blades 142_1 and 142_2 that is obtained in the second direction (Y-axial direction) may be adjusted according to the thickness of the phosphor layer 120*y* that is measured by using the test light-emitting device 162 and the photodetector 164. A method of measuring the thickness of the phosphor layer 120*y* by using the test light-emitting device 162 and the photodetector 164 will be described later with reference to FIGS. 3 and 4.

In some embodiments, before the phosphor 120*x* is coated, a flowing process for removing fine dust from the carrier 130 and a spray process for uniformly providing an additional material, such as an adhesive, a bond, or a releasing agent, on the surface 130T of the carrier 130 may be further performed.

In some other embodiments, after shaping the phosphor layer 120*y* using the first and second blades 142_1 and 142_2 or after measuring the thickness of the phosphor layer 120*y*, at least one of a cooling process, a heating process, and a drying process may be further performed FIG. 3 is an enlarged view of a region K of FIG. 2, illustrating a method of measuring the thickness of the phosphor layer 120*y*.

In FIG. 3, the same reference numerals are used to denote the same elements as in FIGS. 1 and 2, and repeated descriptions thereof are omitted for brevity.

Referring to FIG. 3, the thickness of the phosphor layer 120*y* may be measured by using the test light-emitting device 162 and the photodetector 164.

The test light-emitting device 162 may emit first light Ls toward an opposite surface 130B of the carrier 130. The first light Ls may pass through the carrier 130 and the phosphor layer 120*y*, and the phosphor layer 120*y* may emit second light Lr.

The photodetector 164 may analyze the second light Lr and determine the thickness of the phosphor layer 120*y* based on the analysis. In some embodiments, the photodetector 164 may collect a luminous intensity spectrum with respect to the wavelength of the second light Lr (refer to FIG. 4).

In some embodiments, the test light-emitting device 162 may continuously emit first light Ls having a uniform luminous intensity during the formation of the phosphor layer 120*y*. In some other embodiments, the test light-emitting device 162 may sample a specific period from a time amount for which the phosphor layer 120*y* is formed, and emit the first light Ls only for the sampled specific period.

Similarly, the photodetector 164 may continuously analyze the second light Lr during the formation the phosphor layer 120*y*. Alternatively, the photodetector 164 may sample only a specific period from a time amount for which the phosphor layer 120*y* is formed, and analyze the second light Lr only for the sampled specific period.

The first light Ls may have a different wavelength according to a type of the test light-emitting device 162. Similar to the light-emitting device 110 described with reference to FIG. 1, the test light-emitting device 162 may be an LED chip configured to emit UV light having a wavelength range of about 100 nm to about 430 nm, blue light having a wavelength range of about 430 nm to about 480 nm, green light having a wavelength range of about 500 nm to about 560 nm, or red light having a wavelength range of about 610 nm to about 670 nm.

The present embodiment will describe an example in which the test light-emitting device 162 is a blue LED chip, namely, the test light-emitting device 162 emits the first light Ls having a wavelength range of about 430 nm to about 480 nm. When the test light-emitting device 162 is the blue LED chip, since white light may be output by using a yellow phosphor (not shown), the present embodiment will describe an example in which the phosphor layer 120*y* contains a yellow phosphor.

The first light Ls emitted by the test light-emitting device 162 may be incident to the opposite surface 130B of the carrier 130, pass through the carrier 130 and the phosphor layer 120*y*, and be converted into the second light Lr and output from one surface 120*y*T of the phosphor layer 120*y*.

The second light Lr may include first transmitted light (not shown) having a similar wavelength range to the first light Ls, and second transmitted light (not shown) having a different wavelength range from the first light Ls.

For example, the second light Lr may include yellow light Ly, which serves as the second transmitted light and into which the first light Ls is converted by the yellow phosphor to have a wavelength range of about 520 nm to about 700 nm, and blue light Lb, which serves as the first transmitted light and corresponds to part of the first light Ls that has not been converted into the yellow light Ly. The blue light Lb may have a similar wavelength to the first light Ls.

A luminous intensity Ib of the blue light Lb and the thickness "d" of the phosphor layer 120y may be in a relationship as shown by the following Equation 1:

$$Ib = Io * A * e^{-a*d} \quad (1),$$

wherein Io denotes a luminous intensity of first light Lo that has passed through the carrier 130, namely, the luminous intensity of the first light Lo measured on an opposite surface 120yB of the phosphor layer 120y, A denotes a loss coefficient, and "a" denotes an optical absorptivity of the phosphor layer 120y.

A luminous intensity Iy of the yellow light Ly and the thickness "d" of the phosphor layer 120y may be in a relationship as shown by the following Equation 2:

$$Iy = Io * f(\beta) * f(d) \quad (2),$$

wherein f(β) is a function that depends on physical properties (i.e., a material, a density, and a mixing ratio) of phosphor, and f(d) is a function that represents a variation in amount of radiant light relative to the thickness "d" of the phosphor layer 120y.

From Equations 1 and 2, the thickness "d" of the phosphor layer 120y may be in a relationship with the luminous intensity Iy of the yellow light Ly and the luminous intensity Ib of the blue light Lb as shown by the following Equation 3:

$$d = \frac{1}{a} * \ln\left(\frac{A}{f(\beta) * f(d)}\right) + \frac{1}{a} * \ln\left(\frac{Iy}{Ib}\right), \quad (3)$$

wherein since A denotes a loss coefficient, "a" is a constant denoting an optical absorptivity of the phosphor layer 120y, and f(β) is a function that depends on physical properties of the phosphor, the loss coefficient A, the constant "a", and the function f(β) may be regarded as constants in the relationship with the thickness "d" of the phosphor layer 120y.

Furthermore, although f(d) is a function representing a variation in the amount of radiant light relative to the thickness d of the phosphor layer 120y, the variation in the amount of radiant light in a range of the thickness "d" of the phosphor layer 120y, which is required during a process of fabricating a light-emitting device package, may be treated as a constant. Thus, the thickness "d" of the phosphor layer 120y may be in a relationship with the luminous intensity Iy of the yellow light Ly and the luminous intensity Ib of blue light Lb, as shown by the following Equation 4:

$$d \propto \ln\left(\frac{Iy}{Ib}\right). \quad (4)$$

By using Equation 4, the thickness "d" of the phosphor layer 120y may be obtained from the luminous intensity Iy of the yellow light Ly and the luminous intensity Ib of the blue light Lb in a luminous intensity spectrum (refer to FIG. 4) measured by the photodetector 164. Accordingly, even if a process of shaping and curing the phosphor layer 120y is not yet completed, the thickness "d" of the phosphor layer 120y may be easily measured. Also, since the process of shaping the phosphor layer 120y may be adjusted in real-time based on the measured thickness "d" of the phosphor layer 120y, a process time and costs required to fabricate a phosphor layer (refer to 120 in FIG. 3) of the light-emitting device package may be reduced.

Figure 4:
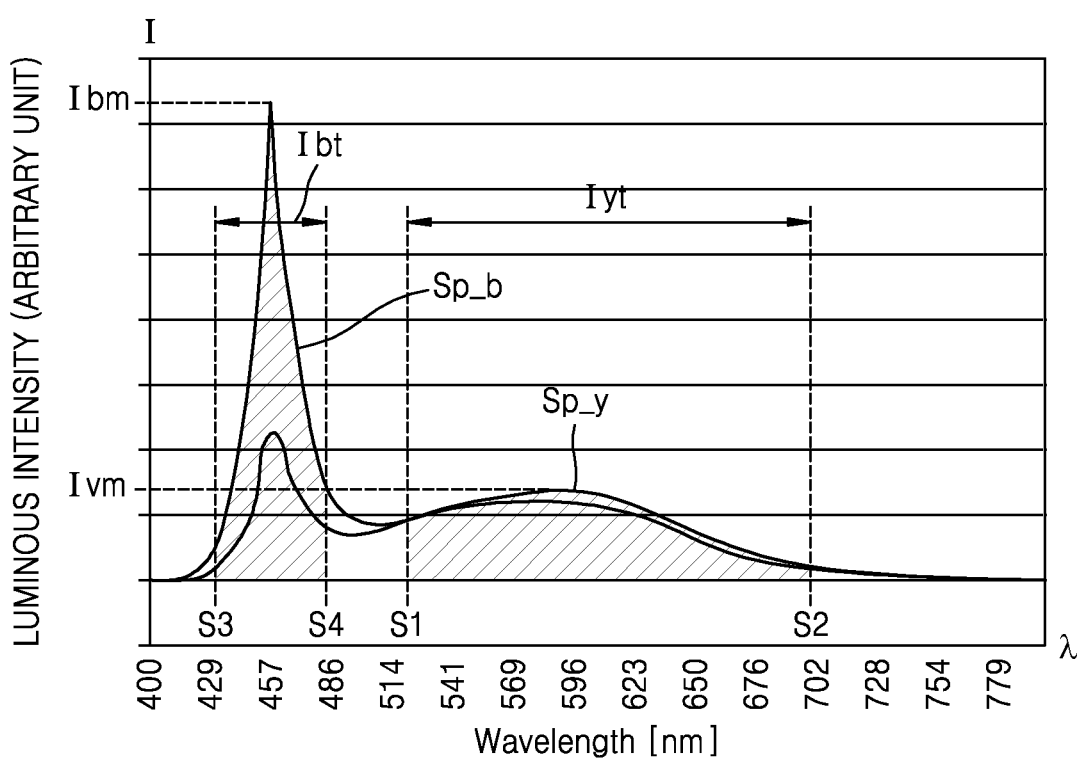
FIG. 4 is a graph showing a luminous intensity spectrum with respect to the wavelength of second light emitted by a phosphor layer, which illustrates a method of measuring a thickness of the phosphor layer.

FIG. 4 is a graph showing a luminous intensity spectrum with respect to a wavelength of second light Lr emitted by the phosphor layer 120y, which illustrates a method of measuring a thickness of the phosphor layer 120y. In FIG. 4, the same reference numerals are used to denote the same elements as in FIGS. 1 to 3, and repeated descriptions thereof are omitted for brevity.

FIG. 4 shows a luminous intensity spectrum with respect to a wavelength λ of the second light Lr. In the luminous intensity spectrum, a luminous intensity I may be an arbitrary unit for comparing output intensities of the second light Lr at respective wavelengths, and is not limited to a specific unit as long as the output intensities of the second light Lr at the respective wavelengths may be compared. For example, the luminous intensity I may refer to irradiance (W/m²).

As described above with reference to FIG. 3, the thickness "d" of the phosphor layer 120y may be obtained from the luminous intensity Iy of the yellow light Ly and the luminous intensity Ib of the blue light Lb, which may be obtained from the luminous intensity spectrum according to the present embodiment. When a ratio of the luminous intensity Iy of the yellow light Ly to the luminous intensity Ib of the blue light Lb is greater than an upper limit of a first predetermined range, a distance between the first and second blades 142_1 and 142_2 and the one surface 130T may be decreased. When the ratio of the luminous intensity Iy of the yellow light Ly to the luminous intensity Ib of the blue light Lb is less than a lower limit of the first predetermined range, the distance between the first and second blades 142_1 and 142_2 and the one surface 130T may be increased. When the ratio of the luminous intensity Iy of the yellow light Ly to the luminous intensity Ib of the blue light Lb is within the first predetermined range, the distance between the first and second blades 142_1 and 142_2 and the one surface 130T may be maintained.

In some embodiments, the thickness "d" of the phosphor layer 120y may be obtained from a maximum luminous intensity Iym of the yellow light Ly and a maximum luminous intensity Ibm of the blue light Lb in the luminous intensity spectrum, as shown by the following Equation 5:

$$d = \frac{1}{a} * \ln\left(\frac{A}{f(\beta) * f(d)}\right) + \frac{1}{a} * \ln\left(\frac{Iym}{Ibm}\right),$$

wherein A denotes a loss coefficient, "a" denotes an optical absorptivity of the phosphor layer 120y, f(β) is a function that depends on physical properties of the phosphor, and f(d) is a function that represents a variation in the amount of radiant light relative to the thickness "d" of the phosphor layer 120y. Since each of A, "a", f(β), and f(d) may be treated as a constant as described above with reference to FIG. 3, the thickness "d" of the phosphor layer 120y may be obtained from the maximum luminous intensity Iym of the yellow light Ly and the maximum luminous intensity Ibm of the blue light Lb. When a ratio of the maximum luminous intensity Iym of the yellow light Ly to the maximum luminous intensity Ib of the blue light Lb is greater than an upper limit of a second predetermined range, the distance between the first and second blades 142_1 and 142_2 and the one surface 130T may be decreased. When the ratio of the maximum luminous intensity Iy of the yellow light Lym to the maximum luminous intensity Ibm of the blue light Lb is less than a lower limit of the second predetermined range, the distance between the first and second blades 142_1 and 142_2 and the one surface 130T may be increased. When the ratio of the maximum luminous intensity Iy of the yellow light Lym to the maximum luminous intensity Ibm of the blue light Lb is within the second predetermined range, the distance between the first and second blades 142_1 and 142_2 and the one surface 130T may be maintained.

The maximum luminous intensity Iym of the yellow light Ly may refer to a maximum luminous intensity I in a yellow wavelength range of about 520 nm to about 700 nm. Similarly, the maximum luminous intensity Ibm of the blue light Lb may refer to a maximum luminous intensity I in a blue wavelength range of about 430 nm to about 480 nm.

In some other embodiments, the thickness "d" of the phosphor layer 120y may be obtained from an amount Iyt of light in a wavelength range of yellow light and an amount Ibt of light in a wavelength range of blue light, as shown by the following Equation 6:

$$d = \frac{1}{a} * \ln\left(\frac{A}{f(\beta) * f(d)}\right) + \frac{1}{a} * \ln\left(\frac{Iyt}{Ibt}\right), \quad (6)$$

wherein A denotes a loss coefficient, "a" denotes an optical absorptivity of the phosphor layer 120y, f(β) is a function that depends on physical properties of the phosphor, and f(d) is a function that represents a variation in the amount of radiant light relative to the thickness "d" of the phosphor layer 120y. Since each of A, "a", f(β), and f(d) may be treated as a constant as described with reference to FIG. 3, the thickness "d" of the phosphor layer 120y may be obtained from the amount Iyt of light in the wavelength range of yellow light and the amount Ibt of light in the wavelength range of blue light.

For example, the amount Iyt of light in the wavelength range of yellow light may be obtained by integrating an emission spectrum Sp_y in the wavelength range of yellow light, as shown by the following Equation 7:

$$Iyt = \int_{S1}^{S2} Sp\_y \, d\lambda \quad (7).$$

In Equation 7, an integral section between S1 and S2 may range from about 520 nm to about 700 nm That is, the wavelength range of yellow light may refer to a wavelength range of about 520 nm to about 700 nm.

Similar to the amount Iyt of light in the wavelength range of yellow light, the amount Ibt of light in the wavelength range of blue light may be obtained by integrating an emission spectrum Sp_b in the wavelength range of blue light, as shown by the following Equation 8:

$$Ibt = \int_{S3}^{S4} Sp\_b \, d\lambda \quad (8).$$

In Equation 8, an integral section between S3 and S4 may range, for example, from about 430 nm to about 480 nm That is, the wavelength range of blue light may be a wavelength range of about 430 nm to about 480 nm.

As described with reference to Equations 6 to 8, the thickness "d" of the phosphor layer 120y may be obtained from the amount Iyt of light in the wavelength range of yellow light and the amount Ibt of light in the wavelength range of blue light so that reliability in the measured thickness "d" of the phosphor layer 120y may be ensured. When a ratio of the amount Iyt of light in in the wavelength range of yellow light Ly to the amount Ibt of light in in the wavelength range of blue light Lb is greater than an upper limit of a third predetermined range, the distance between the first and second blades 142_1 and 142_2 and the one surface 130T may be decreased. When the ratio of the amount Iyt of light in in the wavelength range of yellow light Ly to the amount Ibt of light in in the wavelength range of blue light Lb is less than the lower limit of the third predetermined range, the distance between the first and second blades 142_1 and 142_2 and the one surface 130T may be increased. When the ratio of the amount Iyt of light in in the wavelength range of yellow light Ly to the amount Ibt of light in in the wavelength range of blue light Lb is within the third predetermined range, the distance between the first and second blades 142_1 and 142_2 and the one surface 130T may be maintained.

Figure 5A:
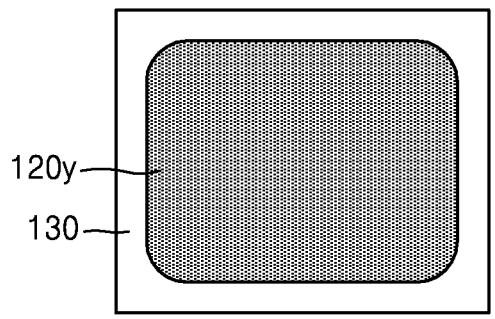
FIGS. 5A to 5C are diagrams of a process of forming a phosphor layer and attaching the phosphor layer to a light-emitting device in a method of fabricating a light-emitting device package according to an exemplary embodiment of the inventive concept.
Figure 5B:
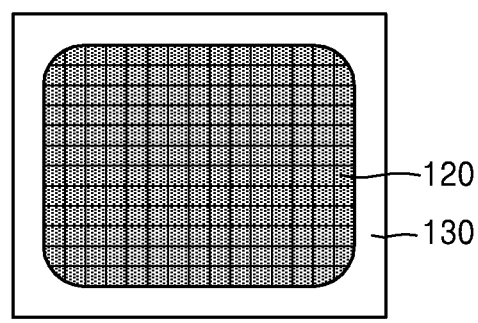
Figure 5C:
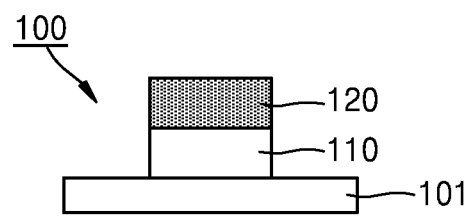

FIGS. 5A to 5C are diagrams of a process of forming the phosphor layer 120y and attaching the phosphor layer 120y to a light-emitting device in a method of fabricating a light-emitting device package according to an exemplary embodiment of the inventive concept. In FIGS. 5A to 5C, the same reference numerals are used to denote the same elements as in FIGS. 1 to 4, and repeated descriptions thereof are omitted for brevity.

Referring to FIG. 5A, the phosphor layer 120y may be formed on the carrier 130. Since the process of forming the phosphor layer 120y is the same as described above with reference to FIGS. 2 through 4, detailed descriptions thereof are omitted.

Referring to FIG. 5B, a plurality of phosphor layers 120 may be formed by sawing the phosphor layer 120y. The process of forming the phosphor layers 120 may be a sawing process using, for example, a blade (not shown).

Referring to FIG. 5C, each of the phosphor layers 120 may be attached to the corresponding one of light-emitting devices 110, thereby completing fabrication of the light-emitting device package 100. The process of attaching each of the phosphor layers 120 to the corresponding light-emitting device 110 may include transferring each of the phosphor layers 120 using, for example, a pick-up tool (not shown) to locate each of the phosphor layers 120 on the corresponding light-emitting device 110, and attaching each of the phosphor layers 120 to the corresponding light-emitting device 110 using an adhesive (not shown).

The present embodiment describes an example in which after the phosphor layers 120 are formed by sawing the phosphor layer 120y, each of the phosphor layers 120 may be attached onto the corresponding light-emitting device 110, but the inventive concept is not limited thereto. For example, after a plurality of light-emitting devices (not shown) are attached onto the phosphor layer 120y, the plurality of phosphor layers 120 may be formed by using a sawing process.

Figure 6:
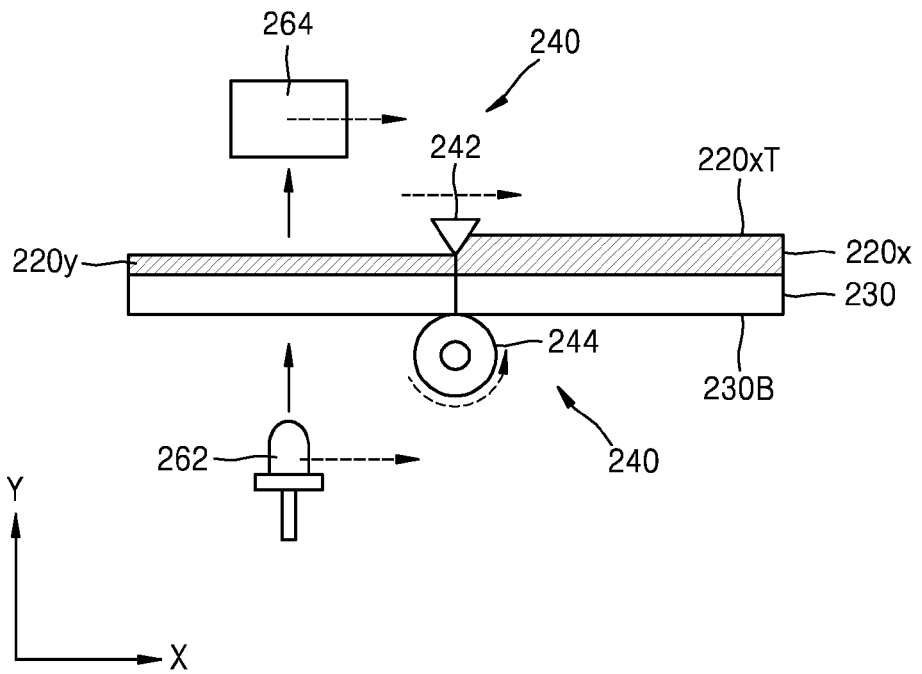
FIG. 6 is a cross-sectional view of a process of forming a phosphor layer in a method of fabricating a light-emitting device package according to another exemplary embodiment of the inventive concept.

FIG. 6 is a cross-sectional view of a process of forming a phosphor layer 220y in a method of fabricating a light-emitting device package according to another exemplary embodiment of the inventive concept. In FIG. 6, the same reference numerals are used to denote the same elements as in FIGS. 1 to 5C, and repeated descriptions thereof are omitted for brevity.

Referring to FIG. 6, a carrier 230 may be coated with phosphor 220x, and the phosphor layer 220y may be formed by shaping the phosphor 220x using a mold 240.

The phosphor 220x and the carrier 230 may have structures and serve functions that are substantially similar to those of the phosphor 120x and the carrier 130 described with reference to FIG. 2. However, in the present embodiment, the mold 240 may move along a first direction (X-axial direction) instead of the carrier 230 during the formation of the phosphor layer 220y.

In some embodiments, the mold 240 may include a blade 242 and a roller 244. The present embodiment illustrates a case in which the mold 240 includes one blade 242, but the inventive concept is not limited thereto. In another case, the mold 240 may include at least one blade, similar to the mold 140 described with reference to FIG. 2.

The blade 242 and the roller 244 may be respectively disposed on one surface 220xT of the phosphor 220x and a surface 230B of the carrier 230, which faces opposite the surface 220xT, and move in the first direction (X-axial direction) during the process of forming the phosphor layer 220y.

In some embodiments, a height of at least one of the blade 242 and the roller 244 that is obtained in a second direction (Y-axial direction) may be adjusted, and a thickness of the shaped phosphor layer 220y may be controlled by adjusting the height of the at least one of the blade 242 and the roller 244 obtained in the second direction (Y-axial direction).

During the formation of the phosphor layer 220y, the thickness of the phosphor layer 22y may be measured by using a test light-emitting device 262 and a photodetector 264.

In some embodiments, similar to the blade 242 and the roller 244, the test light-emitting device 262 and the photodetector 264 may measure the thickness of the phosphor layer 220y while moving in the first direction (X-axial direction). A method of measuring the thickness of the phosphor layer 220y using the test light-emitting device 262 and the photodetector 264 may be performed in a similar manner to the method of measuring the thickness of the phosphor layer 120y as described above with reference to FIGS. 3 and 4.

Figure 7:
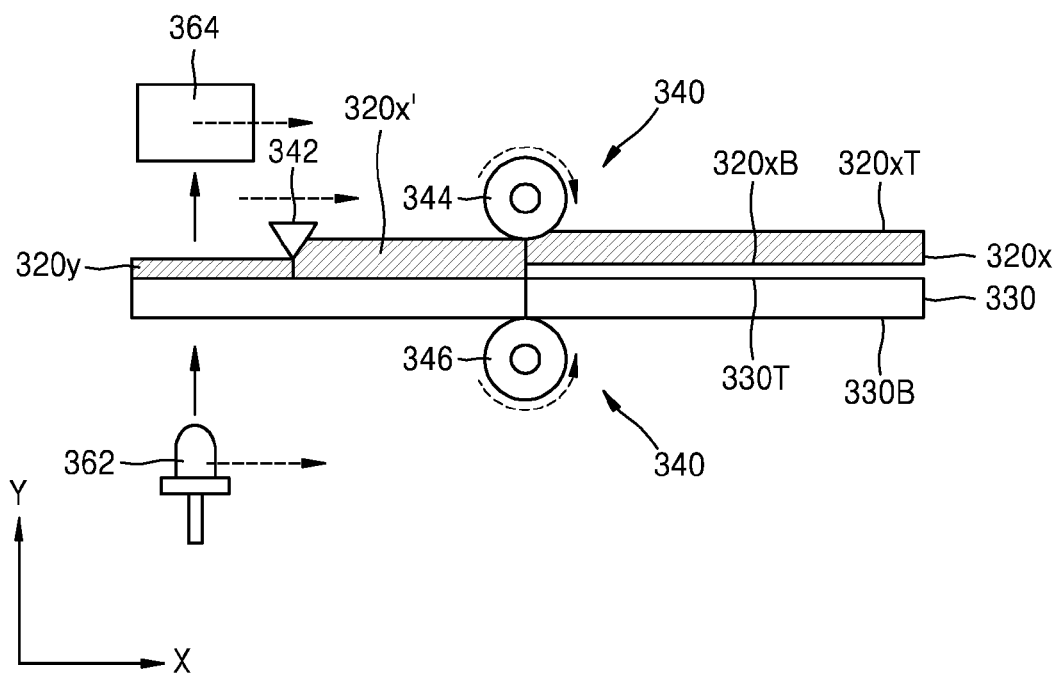
FIG. 7 is a cross-sectional view of a process of forming a phosphor layer in a method of fabricating a light-emitting device package according to another exemplary embodiment of the inventive concept.

FIG. 7 is a cross-sectional view of a process of forming a phosphor layer 320y in a method of fabricating a light-emitting device package according to another exemplary embodiment of the inventive concept. In FIG. 7, the same reference numerals are used to denote the same elements as in FIGS. 1 to 6, and repeated descriptions thereof are omitted for brevity.

Referring to FIG. 7, a carrier 330 may be coated with phosphor 320x, and a phosphor layer 320y may be formed by shaping the phosphor 320x using a mold 340.

The phosphor 320x, the carrier 330, and the mold 340 may have structures and serve functions that are substantially similar to those of the phosphor 220x, the carrier 230, and the mold 240 described with above reference to FIG. 6. However, unlike the mold 240 shown in FIG. 6, the mold 340 according to the present embodiment may include a blade 342, a first roller 344, and a second roller 346.

Meanwhile, the present embodiment illustrates a case in which the mold 340 includes one blade 342, but the inventive concept is not limited thereto. In another case, the mold 340 may include at least one blade, similar to the mold 140 described with reference to FIG. 2.

Although the present embodiment illustrates an example in which the blade 342 is interposed between the first roller 344 and a photodetector 364, but the inventive concept is not limited to the embodiment shown in FIG. 7. For example, the blade 342 may be provided behind the first roller 344 and the photodetector 364. In other words, the photodetector 364 may be provided between the blade 342 and the first roller 344.

The first roller 344 and the second roller 346 may be respectively provided on one surface 320xT of the phosphor 320x and an opposite surface 330B of the carrier 330. While moving in a first direction (X-axial direction), the first roller 344 and the second roller 346 may serve to attach the phosphor 320x onto the carrier 330.

In some embodiments, the phosphor 320x may be attached to the carrier 330 due to pressure and heat applied by the first roller 344 and the second roller 346. In FIG. 7, phosphor 320x refers to phosphor that will be attached to the carrier 330, while phosphor 320x' refers to phosphor that is already attached to the carrier 330. In FIG. 7, an opposite surface 320xB of the phosphor 320x is illustrated as being spaced apart from one surface 330T of the carrier 330 to conceptually distinguish the phosphor 320x from the phosphor 320x', but the inventive concept is not limited thereto. For example, the opposite surface 320xB of the phosphor 320x may be in direct physical contact with the surface 330T of the carrier 330.

The formation of the phosphor layer 320y may include attaching the phosphor 320x' to the carrier 330 by using the first and second rollers 344 and 346, and shaping the phosphor 320x' by using the blade 342. The blade 342 may have a similar structure and serve a similar function to the blade 242 described above with reference to FIG. 6.

During the formation of the phosphor layer 320y, a thickness of the phosphor layer 320y may be measured by using a test light-emitting device 362 and the photodetector 364.

A method of measuring the thickness of the phosphor layer 320y may be performed in a similar manner to the method of measuring the thickness of the phosphor layer 120y as described above with reference to FIGS. 3 and 4.

Figure 8:
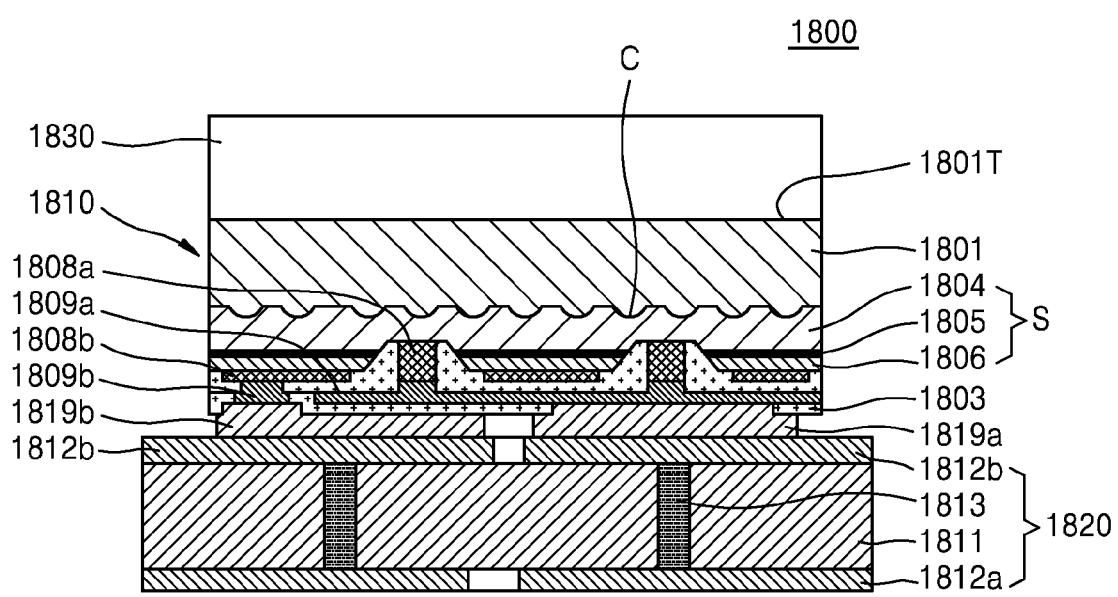
FIGS. 8 and 9 are cross-sectional views of light-emitting device packages according to exemplary embodiments of the inventive concept.
Figure 9:
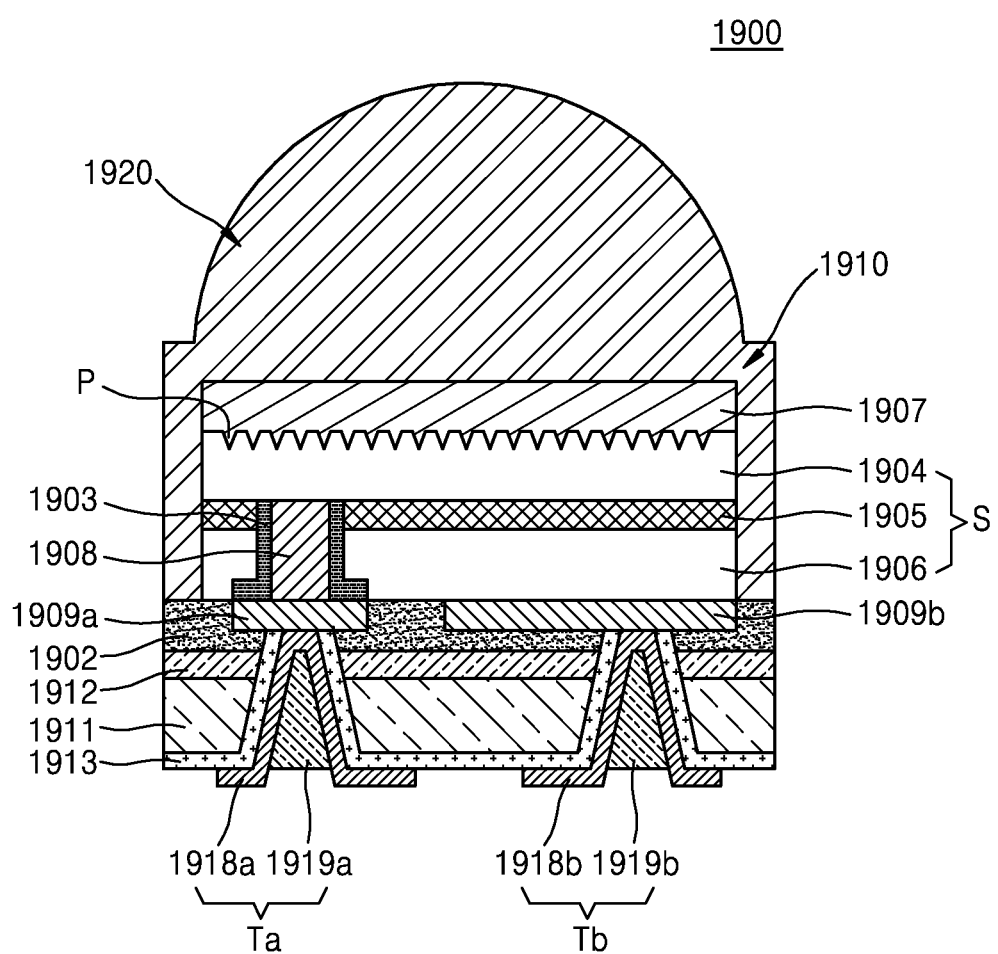

FIGS. 8 and 9 are cross-sectional views of light-emitting device packages according to exemplary embodiments of the inventive concept.

Referring to FIG. 8, a light-emitting device package 1800 may include an LED chip 1810, which may serve as a light source and be mounted on a mounting substrate 1820, and a phosphor layer 1830 attached to the LED chip 1810.

The light-emitting device package 1800 shown in FIG. 8 may include the mounting substrate 1820 and the LED chip 1810 mounted on the mounting substrate 1820.

The LED chip 1810 may include a light-emitting stack structure S disposed on one surface of a substrate 1801, and first and second electrodes 1808a and 1808b disposed opposite the substrate 1801 across the light-emitting stack structure S. Also, the LED chip 1810 may include an insulating unit 1803 formed to cover the first and second electrodes 1808a and 1808b.

The first and second electrodes 1808a and 1808b may be connected to first and second electrode pads 1819a and 1819b through first and second electrical connection units 1809a and 1809b.

The light-emitting stack structure S may include a first-conductivity-type semiconductor layer 1804, an active layer 1805, and a second-conductivity-type semiconductor layer 1806, which may be sequentially stacked on the substrate 1801. The first electrode 1808a may be provided as a conductive via that may be formed through the second-conductivity-type semiconductor layer 1806 and the active layer 1805 and connected to the first-conductivity-type semiconductor layer 1804. The second electrode 1808b may be connected to the second-conductivity-type semiconductor layer 1806.

A plurality of conductive vias may be formed in one light-emitting device region. The number and contact areas of the conductive vias may be controlled such that an area of a region in which the plurality of conductive vias contact the first-conductivity-type semiconductor layer 1804 ranges from about 1% to about 5% of an area of the light-emitting device region in a plan view. For example, a radius of the region in which the conductive vias contact the first-conductivity-type semiconductor layer 1804 in the plan view may range from about 5 µm to about 50 µm, and the number of the conductive vias per light-emitting device region may range from 1 to 50 according to the area of the light-emitting device region. Although depending on the area of the light-emitting device region, three or more conductive vias may be provided per light-emitting device region. The conductive vias may be spaced apart from one another by a distance of about 100 µm to about 500 µm, and more preferably, about 150 µm to about 450 µm, and arranged as a matrix type in rows and columns. When a distance between the conductive vias is less than about 100 μm, the number of the conductive vias may increase, and an emission area may comparatively decrease, thereby degrading luminous efficiency. In contrast, when the distance between the conductive vias is greater than about 500 μm, current diffusion may be precluded to degrade luminous efficiency. Although depending on thicknesses of the second-conductivity-type semiconductor layer 1806 and the active layer 1805, a depth of the conductive vias may range from about 0.5 μm to about 5.0 μm.

The first and second electrodes 1808a and 1808b may be formed by depositing a conductive ohmic material on the light-emitting stack structure S. The first and second electrode 1808a and 1808b may include at least one of silver (Ag), aluminum (Al), nickel (Ni), chromium (Cr), copper (Cu), gold (Au), palladium (Pd), platinum (Pt), tin (Sn), titanium (Ti), tungsten (W), rhodium (Rh), iridium (Ir), ruthenium (Ru), magnesium (Mg), zinc (Zn), or an alloy thereof. For example, the formation of the second electrode 1808b may include stacking an Ag ohmic electrode on the second-conductivity-type semiconductor layer 1806. The Ag ohmic electrode may serve as a light reflective layer. Optionally, a single layer formed of Ni, Ti, Pt, or W may be stacked on the Ag ohmic electrode or layers formed of alloys thereof may be alternately stacked on the Ag ohmic electrode. For example, a Ni/Ti layer, a TiW/Pt layer, or a Ti/W layer may be stacked under the Ag ohmic electrode or the Ni/Ti layer, the TiW/Pt layer, and the Ti/W layer may be alternately stacked under the Ag ohmic electrode.

The formation of the first electrode 1808a may include stacking a Cr layer on the first-conductivity-type semiconductor layer 1804 and sequentially stacking Au/Pt/Ti layers on the Cr layer or include stacking an Al layer on the second-conductivity-type semiconductor layer 1806 and sequentially stacking Ti/Ni/Au layers on the Al layer.

Unlike in the present embodiment, various other materials or stack structures may be applied to the first and second electrodes 1808a and 1808b to improve ohmic or reflection characteristics thereof.

The insulating unit 1803 may include an open region to expose at least a portion of the first and second electrodes 1808a and 1808b, and the first and second electrode pads 1819a and 1819b may be connected to the first and second electrodes 1808a and 1808b, respectively. The insulating unit 1803 may be formed by depositing a $SiO_2$ and/or SiN layer to a thickness of about 0.01 μm to about 3 μm using a chemical vapor deposition (CVD) process at a temperature 500° C. or lower.

The first and second electrodes 1808a and 1808b may be disposed in the same direction and may be mounted as a flip-chip type on a lead frame as described below. In this case, the first and second electrodes 1808a and 1808b may be oriented in the same direction.

In a first electrode structure, the first electrical connection unit 1809a may be formed by the first electrode 1808a having the conductive vias, which may be formed through the first-conductivity-type semiconductor layer 1804 and the active layer 1805 and connected to the first-conductivity-type semiconductor layer 1804 in the light-emitting stack structure S.

The numbers, shapes, and pitches of the conductive vias and the first electrical connection units 1809a and areas of contact of the conductive vias and the first electrical connection units 1809a with the first-conductivity-type semiconductor layer 1804 may be appropriately adjusted to reduce a contact resistance. The conductive vias and the first electrical connection units 1809a may be arranged in rows and columns to improve the flow of current.

A second electrode structure may include the second electrode 1808b formed directly on the second-conductivity-type semiconductor layer 1806 and the second electrical connection unit 1809b formed on the second electrode 1808b. The second electrode 1808b may function to form an electrical ohmic contact with the second-conductivity-type semiconductor layer 1806. In addition, the second electrode 1808b may be formed of a light reflection material and effectively emit light from the active layer 1805 toward the substrate 1801 while the LED chip 1810 is being mounted as a flip-chip type. The second electrode 1808b may be formed of a light-transmissive conductive material, such as a transparent conductive oxide (TCO), according to a main light emission direction.

The above-described two electrode structures may be electrically isolated from each other by the insulating unit 1803. Although the insulating unit 1803 may be formed of any insulating material or any insulating object, the insulating unit 1803 may be preferably formed of a material having a low optical absorptivity. For example, the insulating unit 1803 may be formed of silicon oxide or silicon nitride, such as $SiO_2$, $SiO_xN_y$, or $Si_xN_y$. When necessary, the insulating unit 1803 may have a light-reflective structure by dispersing light-reflective fillers in a light-transmissive material.

The first and second electrode pads 1819a and 1819b may be respectively connected to the first and second electrical connection units 1809a and 1809b and serve as external terminals of the LED chip 1810. For example, the first and second electrode pads 1819a and 1819b may be formed of gold (Au), silver (Ag), aluminium (Al), titanium (Ti), tungsten (W), copper (Cu), tin (Sn), nickel (Ni), platinum (Pt), chromium (Cr), NiSn, TiW, AuSn, or a eutectic metal thereof. In this case, when the first and second electrode pads 1819a and 1819b are mounted on the mounting substrate 1820, the first and second electrode pads 1819a and 1819b may be bonded to the mounting substrate 1820 using a eutectic metal. Thus, additional solder bumps additional solder bumps, which are typically required for a flip-chip bonding process, may not be used. When the first and second electrode pads 1819a and 1819b are mounted using a eutectic metal, a higher heat dissipation effect may be obtained than when solder bumps are used. The first and second electrode pads 1819a and 1819b may be formed to have large areas to achieve a good heat dissipation effect.

Unless expressly described otherwise, the substrate 1801 and the light-emitting stack structure S may be understood with reference to the previous descriptions. Although not specifically shown, a buffer layer may be formed between the light-emitting stack structure S and the substrate 1801, and an undoped semiconductor layer formed of, for example, a nitride-based semiconductor, may be adopted as the buffer layer to reduce lattice defects of the light-emitting structure S grown on the buffer layer.

The substrate 1801 may have first and second main surfaces disposed opposite each other, and a rough structure may be formed on at least one of the first and second main surfaces of the substrate 1801. The rough structure formed on at least one of the first and second main surfaces of the substrate 1801 may be formed by etching a portion of the substrate 1801, and include the same material as the substrate 1801. Alternatively, the rough structure may be formed of a different material from the substrate 1801.

As in the present embodiment, the rough structure may be formed at an interface between the substrate 1801 and the first-conductivity-type semiconductor layer 1804 so that light emitted by the active layer 1805 may travel along various paths. Thus, an optical absorptivity of light absorbed by the first-conductivity-type semiconductor layer 1804 may be reduced and a light scattering rate may increase, thereby increasing light extraction efficiency.

Specifically, the rough structure may have a regular or irregular shape. When the rough structure is formed of the different material from the substrate 1801, the rough structure may be a transparent conductor, a transparent insulator, or a highly reflective material. The transparent insulator may be silicon oxide ($SiO_2$), silicon nitride ($SiN_x$), aluminium oxide ($Al_2O_3$), hafnium oxide (HfO), titanium oxide ($TiO_2$), or zirconium oxide (ZrO). The transparent conductor may be a TCO, such as zinc oxide (ZnO) or indium oxide containing an additive (e.g., magnesium (Mg), silver (Ag), zinc (Zn), scandium (Sc), hafnium (Hf), zirconium (Zr), tellurium (Te), selenium (Se), tantalum (Ta), tungsten (W), niobium (Nb), copper (Cu), silicon (Si), nickel (Ni), cobalt (Co), molybdenum (Mo), chromium (Cr), or tin (Sn)). The reflective material may be silver (Ag), aluminium (Al), or a distributed Bragg reflector (DBR) including a plurality of layers having different refractive indices, but the inventive concept is not limited thereto.

Although not shown in FIG. 8, the substrate 1801 may be removed from the first-conductivity-type semiconductor layer 1804. The removal of the substrate 1801 may be performed using a laser lift-off (LLO) process using a laser, an etching process, or a polishing process. Also, after removing the substrate 1801, a rough structure may be formed on the surface of the first-conductivity-type semiconductor layer 1804.

As shown in FIG. 8, the LED chip 1810 may be mounted on the mounting substrate 1820. The mounting substrate 1820 may include an upper electrode layer 1812*b* and a lower electrode layer 1812*a*, which are respectively formed on top and bottom surfaces of a substrate main body 1811, and a via 1813, which may penetrate the substrate main body 1811 to connect the upper and lower electrode layers 1812*b* and 1812*a*. The substrate main body 1811 may be formed of a resin, ceramic, or a metal, and the upper electrode layer 1812*b* or the lower electrode layer 1812*a* may be a metal layer formed of, for example, Au, Cu, Ag, or Al.

A substrate on which the LED chip 1810 is mounted is not limited to the mounting substrate 1820 shown in FIG. 8, and may be any substrate on which an interconnection structure for driving the LED chip 1810 is formed. For example, a package structure in which an LED chip is mounted on a package main body having a pair of lead frames may be provided.

The phosphor layer 1830 may be attached onto a top surface of the LED chip 1810 (i.e., a top surface 1801T of the substrate 1801) and convert light emitted by the LED chip 1810 into white light. For example, when the LED chip 1810 is a blue LED chip configured to emit blue light having a wavelength range of about 430 nm to about 480 nm, the phosphor layer 1830 may include a yellow phosphor, which may be understood with reference to FIG. 2. Also, the phosphor layer 1830 may be formed using a similar process to the process of fabricating the light-emitting device package as described above with reference to FIGS. 1 through 7.

[Other Examples of the LED Chip]

In addition to the above-described LED chip, LED chips having various structures may be applied to a light-emitting device package according to the present embodiment. For example, an LED chip in which surface-plasmon polaritons (SPPs) are formed at an interface between a metal and a dielectric material and made to interact with quantum well excitons to greatly improve light extraction efficiency may be effectively employed.

[Example of a Light-Emitting Device Package: Chip-Scale Package (CSP)]

An LED chip package having a CSP structure may be used as an example of the above-described light-emitting device package.

A CSP may be appropriate for mass production because the CSP may downscale an LED chip package and simplify a manufacturing process. In particular, the CSP may be effectively used for an illumination system because a wavelength conversion material (e.g., as a phosphor layer) and an optical structure (e.g., a lens) may be unified with an LED chip.

As an example of the CSP, FIG. 9 shows a package structure in which an electrode is formed on a bottom surface of an LED 1910 in an opposite direction to a main light extraction surface thereof and a phosphor layer 1907 and a lens 1920 are formed as a unified type.

A CSP 1900 shown in FIG. 9 may include a light-emitting stack structure S, a first terminal unit Ta and a second terminal Tb, the phosphor layer 1907, and the lens 1920, which may be disposed on or in a substrate 1911.

The light-emitting stack structure S may be a stack structure including a first-conductivity-type semiconductor layer 1904, a second-conductivity-type semiconductor layer 1906, and an active layer 1905 interposed therebetween. In the present embodiment, the first- and second-conductivity-type semiconductor layers 1904 and 1906 may be p- and n-type semiconductor layers, respectively. Also, the first- and second-conductivity-type semiconductor layers 1904 and 1906 may be formed of a nitride semiconductor, for example, $Al_xIn_yGa_{(1-x-y)}N$ ($0 \leq x \leq 1$, $0 \leq y \leq 1$, $0 \leq x+y \leq 1$). However, in addition to the nitride semiconductor, the first- and second-conductivity-type semiconductor layers 1904 and 1906 may be formed of a gallium arsenide (GaAs)-based semiconductor or a gallium phosphide (GaP)-based semiconductor.

The active layer 1905 formed between the first- and second-conductivity-type semiconductor layers 1904 and 1906 may emit light having predetermined energy due to recombination between electrons and holes. The active layer 1905 may have a multiple quantum well (MQW) structure in which quantum well layers and quantum barrier layers are alternately stacked. For example, an InGaN/GaN structure or an AlGaN/GaN structure may be used as the MQW structure.

The first- and second-conductivity-type semiconductor layer 1904 and 1906 and the active layer 1905 may be formed using a known semiconductor growing process, such as a metal organic CVD (MOCVD) process, a molecular beam epitaxy (MBE) process, or a hydride vapor phase epitaxy (HVPE) process.

The LED 1910 shown in FIG. 9 may have a surface from which a growth substrate is removed, and a rough portion P may be formed on the surface from which the growth substrate is removed. Also, the phosphor layer 1907 serving as a light conversion layer may be formed on the surface of the LED 1910 on which the rough portion P is formed.

The LED 1910 may include a first electrode 1909*a* and a second electrode 1909*b* connected to the first- and second-conductivity-type semiconductor layers 1904 and 1906, respectively. The first electrode 1909*a* may include a conductive via 1908 that is formed through the second-conductivity-type semiconductor layer 1906 and the active layer 1905 and connected to the second-conductivity-type semiconductor layer 1904. An insulating layer 1903 may be formed between the conductive via 1908 and the active layer 1905 and the second-conductivity-type semiconductor layer 1906 to prevent occurrence of a short.

Although the present embodiment illustrates an example in which only one conductive via 1908 is formed, at least two conductive vias 1908 may be provided to facilitate current spreading and may be arranged in various shapes.

The present embodiment describes an example in which the mounting substrate 1911 is a supporting substrate (e.g., a silicon substrate) to which a semiconductor process may be easily applied, but the inventive concept is not limited thereto. The mounting substrate 1911 and the LED 1910 may be bonded to each other by using first and second bonding layers 1902 and 1912. The first and second bonding layers 1902 and 1912 may be formed of an insulating material or a conductive material. For example, the insulating material may be an oxide, such as $SiO_2$ or SiN, or a resin-based material, such as a silicon resin or an epoxy resin. The conductive material may be Ag, Al, Ti, W, Cu, Sn, Ni, Pt, Cr, NiSn, TiW, AuSn, or a eutectic metal thereof. The bonding process may include applying the first and second bonding layers 1902 and 1912 to bonding surfaces of the LED 1910 and the substrate 1911, respectively, and bonding the LED 1910 and the substrate 1911 to each other.

A via may be formed from a bottom surface of the mounting substrate 1911 in the mounting substrate 1911 and connected to the first and second electrodes 1909a and 1909b of the bonded LED 1910. An insulating material 1913 may be formed on a side surface of the via and the bottom surface of the mounting substrate 1911. When the mounting substrate 1911 is a silicon substrate, the insulating material 1913 may include a silicon oxide layer formed using a thermal oxidation process. A first terminal Ta and a second terminal Tb may be formed by filling the via with a conductive material, and connected to the first and second electrodes 1909a and 1909b. The first and second terminals Ta and Tb may respectively include seed layers 1918a and 1918b and plating filling units 1919a and 1919b formed by performing a plating process using the seed layers 1918a and 1918b.

Figure 10:
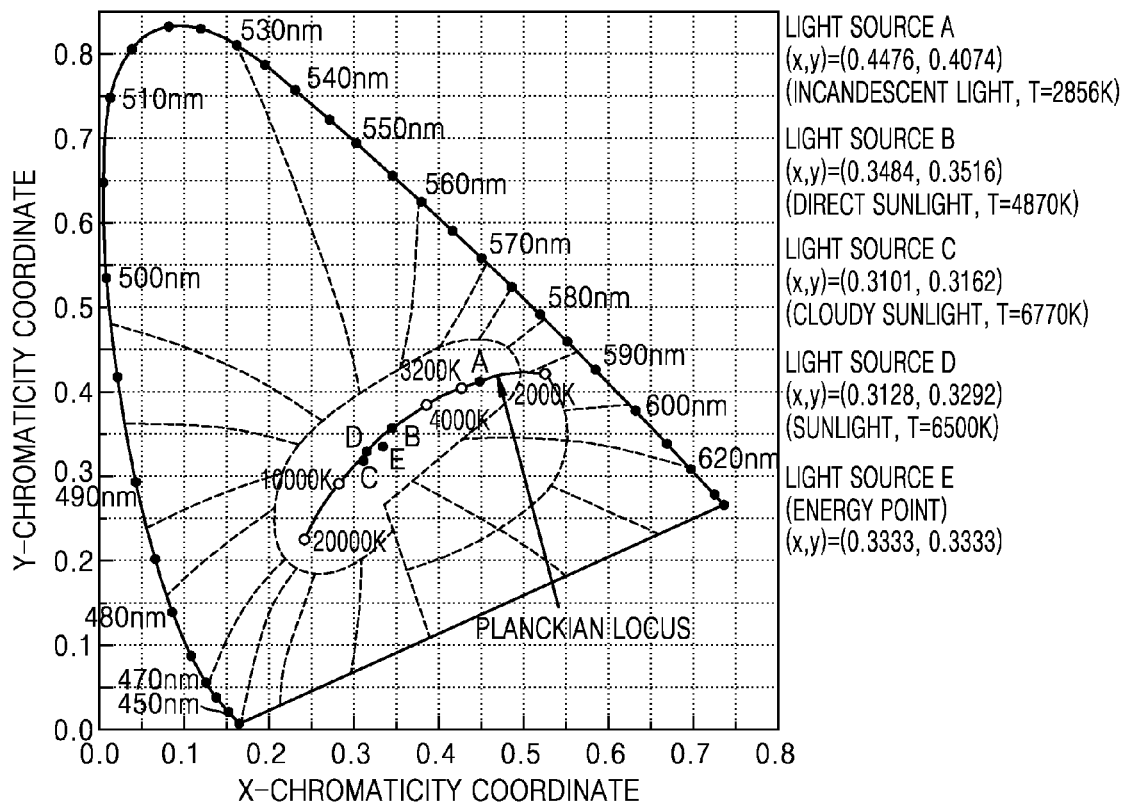
FIG. 10 is a diagram showing a Planckian spectrum of light emitted by a light-emitting device package according to exemplary embodiments of the inventive concept.
Figure 11:
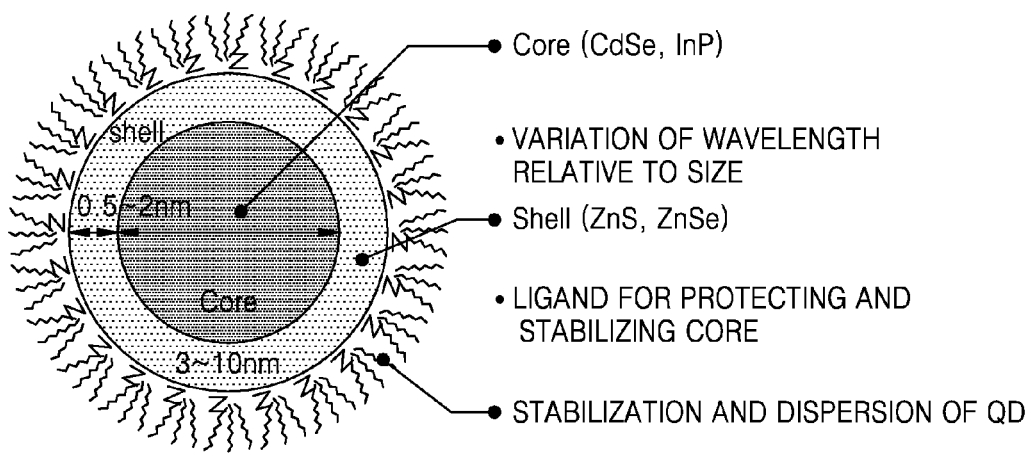
FIG. 11 is a diagram of an example of a quantum dot (QD) structure, which is applicable to a light-emitting device package according to an exemplary embodiment of the inventive concept.

FIG. 10 is a diagram showing a Planckian spectrum of light emitted by a light-emitting device package according to exemplary embodiments of the inventive concept. FIG. 11 is a diagram of an example of a quantum dot (QD) structure, which is applicable to a light-emitting device package according to exemplary embodiments of the inventive concept.

Referring to FIG. 10, a light-emitting device of the light-emitting device package may emit blue light, green light, or red light according to the kind of a compound semiconductor constituting the light-emitting device. Alternatively, the LED chip may emit UV light. In some other embodiments, the light-emitting device may include a UV LED chip, a laser diode chip, or an organic LED chip. However, the light-emitting device according to the inventive concept is not limited to the above-described examples and may include various optical devices.

A color rendering index (CRI) of the light-emitting device may be controlled to be within the range of 40 (e.g., a sodium lamp) to 100 (e.g., solar light) and emit various types of white light having a color temperature range from 2000K to 20000K. When necessary, color of illumination light may be adjusted to an ambient atmosphere or mood by generating visible light (e.g., purple light, blue light, green light, red light, and orange light) or infrared (IR) light. Also, the light-emitting device may generate light having a special wavelength to stimulate plant growth.

White light generated by a combination of a blue LED with yellow, green, red phosphor and/or green and red light-emitting devices may have at least two peak wavelengths. Coordinates (x, y) of the white light in a CIE 1931 coordinate system may be located on a segment connecting (0.4476, 0.4074), (0.3484, 0.3516), (0.3101, 0.3162), (0.3128, 0.3292), and (0.3333, 0.3333) or located in a region surrounded with the segment and a blackbody radiator spectrum. A color temperature of the white light may be between 2000K and 20000K.

For example, phosphors according to exemplary embodiments of the inventive concept may have formulas and colors as follows.

Oxide-based phosphors: yellow and green (Y, Lu, Se, La, Gd, Sm)$_3$(Ga, Al)$_5$O$_{12}$:Ce and blue BaMgAl$_{10}$O$_{17}$:Eu, 3Sr$_3$(PO$_4$)$_2$.CaCl:Eu Silicate-based phosphors: yellow and green (Ba, Sr)$_2$SiO$_4$:Eu, yellow and orange (Ba, Sr)$_3$SiO$_5$:Eu, and Ca$_{1.2}$Eu$_{0.8}$SiO$_4$ corresponding to red Ca$_2$SiO$_4$:Eu Nitride-based phosphors: green β-SiAlON:Eu, yellow (La, Gd, Lu, Y, Sc)$_3$Si$_6$N$_{11}$:Ce, orange α-SiAlON:Eu, red (Sr, Ca)AlSiN$_3$:Eu, (Sr, Ca)AlSiON$_3$:Eu, (Sr, Ca)$_2$Si$_5$N$_8$:Eu, (Sr, Ca)$_2$Si$_5$(ON)$_8$:Eu, (Sr, Ba)SiAl$_4$N$_7$:Eu, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5≤x≤3, 0<z<0.3, 0<y≤4), wherein Ln may be at least one element selected from the group consisting of a Group IIIa element and a rare-earth element, and M may be at least one element selected from the group consisting of calcium (Ca), barium (Ba), strontium (Sr), and magnesium (Mg)

Sulfide-based phosphors: red (Sr, Ca)S:Eu, Gd)$_2$O$_2$S:Eu, green SrGa$_2$S$_4$:Eu Fluoride-based phosphors: KSF-based red K$_2$SiF$_6$:Mn$^{4+}$, K$_2$TiF$_6$:Mn$^{4+}$, NaYF$_4$:Mn$^{4+}$, NaGdF$_4$:Mn$^{4+}$ Compositions of the phosphors should be based on stoichiometry, and respective elements may be replaced by other elements in respective groups in the periodic table. For example, Sr may be replaced by Group II elements (alkaline earth metals), such as Ba, Ca, or Mg, and Y may be replaced by a lanthanum-based element, such as Tb, Lu, Sc, or Gd. Also, europium (Eu) serving as an activator may be replaced by cerium (Ce), terbium (Tb), praseodymium (Pr), erbium (Er), or ytterbium (Yb) according to a desired energy level. An activator may be used alone or a co-activator may be further applied to vary characteristics.

Furthermore, materials, such as quantum dots (QDs), may be used as materials capable of replacing the phosphors, and the phosphors and the QD may be used alone or in combination with one another for LEDs.

A QD may have a structure including a core (about 3 nm to about 10 nm), such as CdSe or InP, a shell (about 0.5 nm to about 2 nm), such as ZnS and ZeSe, and a ligand for stabilizing the core and the shell, and may be embodied in various colors according to size.

FIG. 12 is a table showing types of phosphors with respect to application fields of a white light-emitting device package using a blue light-emitting device according to exemplary embodiments of the inventive concept.

A method of coating phosphors or QDs may include at least one of a process of spraying the phosphors or QDs onto a LED chip or a light-emitting device, a process of covering the LED chip or the light-emitting device with a film, or a process of attaching a film or a ceramic phosphor sheet to the LED chip or the light-emitting device.

The spraying process may typically include a dispensing process and a spray coating process, and the dispensing process may include a pneumatic process and a mechanical process, such as a screw fastening process or a linear-type fastening process. In a jetting process, an amount of dots may be adjusted by jetting a very small amount of phosphor or QDs, and color coordinates may be controlled by adjusting the amount of dots. In a process of collectively coating phosphor on a wafer level or on a light-emitting device substrate using the spraying process, productivity may be increased, and a thickness of the coated layer may be easily controlled.

The process of covering the LED chip or the light-emitting device with the film may include an electrophoresis process, a screen printing process, or a phosphor molding process, which may be selectively adopted depending on whether or not side surfaces of a chip need to be coated with the film.

At least two phosphor layers having different light-emitting wavelengths may be separated to control efficiency of a long-wavelength light-emitting phosphor configured to re-absorb light emitted in a short wavelength range, from among at least two phosphors having different light-emitting wavelengths. Also, a DBR (or an omni-directional reflector (ODR)) layer may be provided between the respective phosphor layers in order to minimize re-absorption of light and interference between an LED chip and the at least two phosphor layers.

To form a uniform coated layer, phosphor may be formed as a film or ceramic type and then attached onto a chip or a light-emitting device.

A light conversion material may be disposed in a remote manner to vary optical efficiency or light distribution characteristics. In this case, the light conversion material may be disposed along with a transparent polymer or glass according to endurance and heat resistance thereof.

Since a technique of coating phosphor greatly affects optical properties of an LED device, techniques of controlling phosphor coating layers or uniformly dispersing phosphors have variously been studied. QDs may be disposed on an LED chip or a light-emitting device in the same manner as phosphors. Also, the QDs may be formed in the LED chip (or the light-emitting device) and interposed between glass and a transparent polymer material and perform a light conversion operation.

A transmissive material may be disposed as a filler on an LED chip or a light-emitting device to protect the LED chip or the light-emitting device from the outside or improve light extraction efficiency The transmissive material may be a transparent organic material, such as an epoxy, silicone, a hybrid of an epoxy and silicone, and may be cured by heating or irradiation with light, or by allowing for the transmissive material to set over a predetermined period of time.

Polydimethyl siloxane (PDMS) may be categorized as methyl-based silicone, while polymethylphenyl siloxane may be categorized as a phenyl-based silicone. The methyl-based silicone may differ from the phenyl-based silicone in terms of a refractive index, moisture permeability, a light transmittance, light-resistant stability, and heat-resistant stability. Also, the silicone may be cured at a different rate according to a crosslinking agent and a catalyst and affect dispersion of phosphor.

Light extraction efficiency may depend on a refractive index of the filler. At least two silicones having different refractive indices may be sequentially stacked to minimize a difference in refractive indices between a medium disposed at an outermost portion of a chip from which blue light is emitted and a medium from which light emitted into the air.

In general, the methyl-based silicone may have the highest heat-resistant stability, and the phenyl-based silicone, the hybrid, and the epoxy may vary at a low rate with a rise in temperature in an orderly fashion. Silicones may be classified into a gel type, an elastomer type, and a resin type according to hardness.

The light-emitting device may further include a lens to radially guide light irradiated by a light source. In this case, a previously shaped lens may be attached onto the LED chip or the light-emitting device. Alternatively, a flowable organic solvent may be injected into a mold on which the LED chip or the light-emitting device is mounted, and solidified to form the lens.

The lens may be directly attached to the filler formed on the chip or spaced apart from the filler by adhering an outer portion of the light-emitting device to an outer portion of the lens. When the flowable organic solvent is injected into the mold, an injection molding process, a transfer molding process, or a compression molding process may be used.

Light distribution characteristics may be affected by a shape of the lens (e.g., a concave shape, a convex shape, a rough shape, a conic shape, or a geometric structure). The shape of the lens may be modified to meet the needs for efficiency and light distribution characteristics.

The light-emitting device may be formed of, for example, a semiconductor. For instance, the light-emitting device may be formed of a nitride semiconductor, which may be represented by formula: $Al_xGa_yIn_zN$ ($0 \leq x \leq 1$, $0 \leq y \leq 1$, $0 \leq z \leq 1$, $x+y+z=1$). The light-emitting device may be formed by epitaxially growing a nitride semiconductor, such as InN, AlN, InGaN, AlGaN, or InGaAlN, on a substrate using a vapor growth process, such as an MOCVD process. In addition to the nitride semiconductor, the light-emitting device may be formed of a semiconductor, such as ZnO, ZnS, ZnSe, SiC, GaP, GaAlAs, or AlInGaP. The semiconductor may include a stack structure formed by sequentially stacking an n-type semiconductor layer, an emission layer, and a p-type semiconductor layer. The emission layer (or an active layer) may include a stacked semiconductor having an MQW structure or a single quantum well (SQW) structure or a stacked semiconductor having a double hetero structure. Although the light-emitting device may be a device configured to emit blue light, the inventive concept is not limited thereto. The light-emitting device may be selected to emit light having an arbitrary wavelength.

Figure 13A:
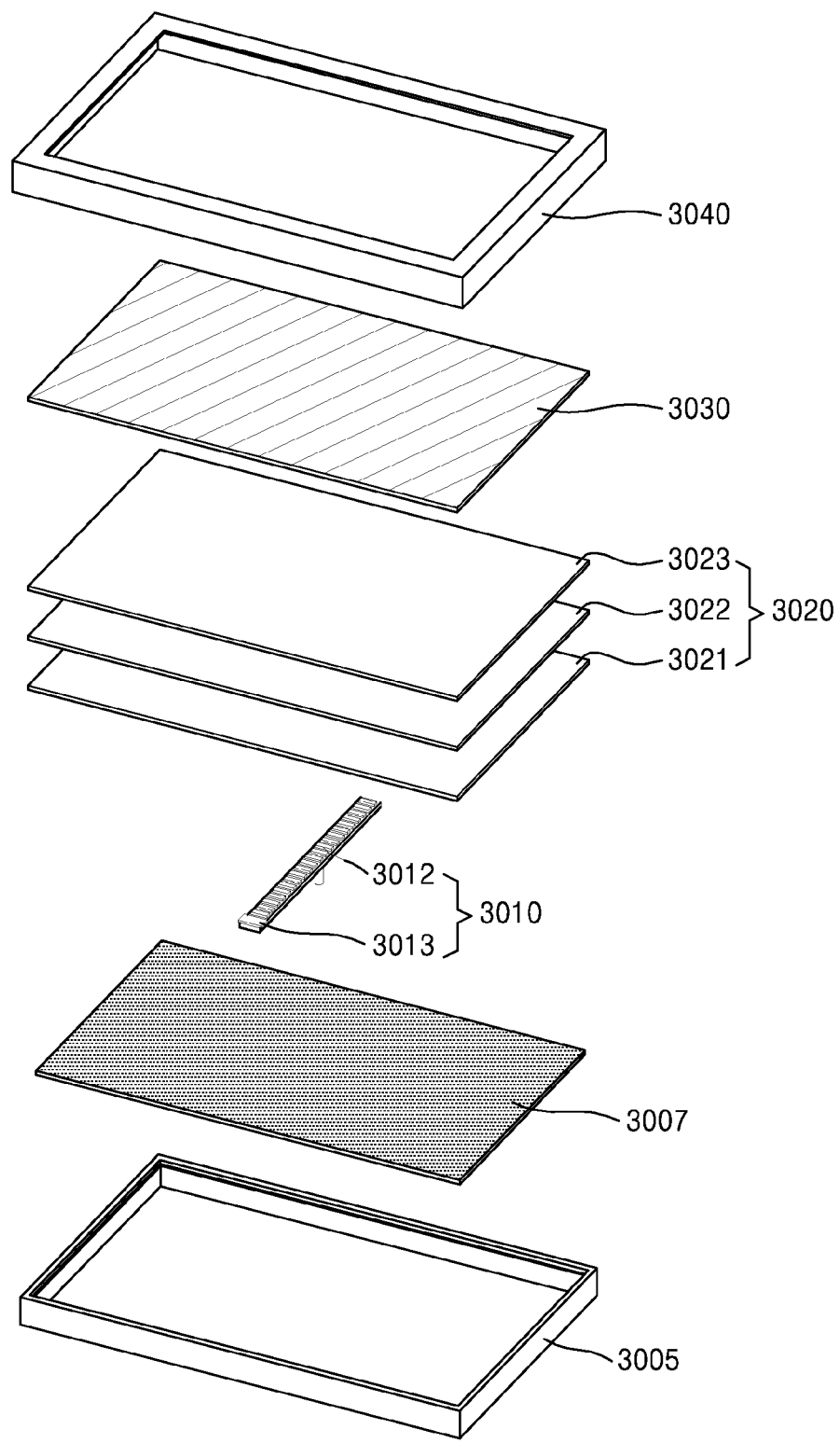
FIG. 13A is an exploded perspective view of an example of a backlight assembly including a light-emitting device array unit in which a light-emitting device package fabricated using a method of fabricating a light-emitting device package according to exemplary embodiments of the inventive concept is arranged.
Figure 13B:
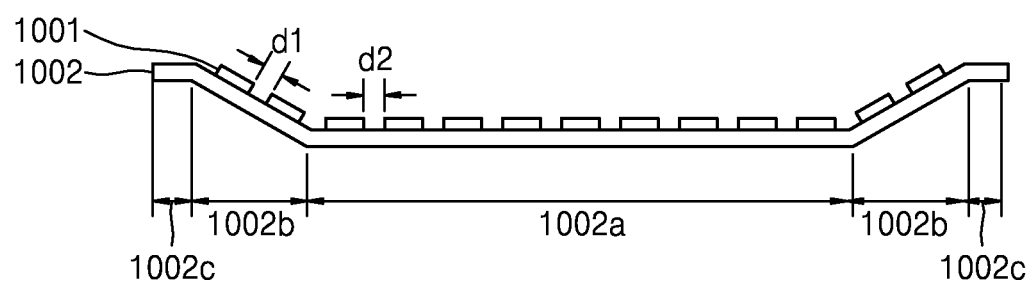
FIG. 13B is a cross-sectional view of an example of a light-emitting module that may be included in the backlight assembly of FIG. 13A.

FIG. 13A is an exploded perspective view of an example of a backlight (BL) assembly including a light-emitting device array unit in which a light-emitting device package fabricated using a method of fabricating a light-emitting device package according to exemplary embodiments of the inventive concept is arranged, and FIG. 13B is a cross-sectional view of an example of a light-emitting module that may be included in the BL assembly of FIG. 13A.

As shown in FIG. 13A, a direct-type BL assembly 3000 may include a lower cover 3005, a reflection sheet 3007, a light-emitting module 3010, an optical sheet 3020, a liquid crystal (LC) panel 3030, and an upper cover 3040. A light-emitting device array unit, according to an exemplary embodiment, may be used as the light-emitting module 3010 included in the direct-light-type BL assembly 3000.

According to an exemplary embodiment, the light-emitting module 3010 may include a light-emitting device array 3012 including at least one light-emitting device package and a circuit substrate, and a rank storage unit 3013. The light-emitting device array 3012 may include one of the light-emitting device packages described with reference to FIGS. 1 to 12. The light-emitting device array 3012 may receive power for emitting light from a light-emitting device driver disposed outside the direct-type BL assembly 3000, and the light-emitting device driver may control current supplied to the light-emitting device array 3012.

In an embodiment, as shown in FIG. 13B, the light-emitting module may include a first planar portion 1002a corresponding to a main region of a circuit substrate 1002, an inclined portion 1002b that is disposed adjacent to the first planar portion 1002a and of which at least a portion is bent, and a second planar portion 1002c disposed at a corner of the circuit substrate 1002 outside the inclined portion 1002b. A plurality of light sources may be arranged on the first planar portion 1002a and spaced a first distance d2 apart from one another, and at least one light source 1001 may be arranged on the inclined portion 1002b and spaced a second distance d1 apart from one another. The first distance d2 may be equal to the second distance d1. A width of the inclined portion 1002b (or a length of the inclined portion 1002b obtained in a cross-sectional view) may be smaller than a width of the first planar portion 1002a and larger than a width of the second planar portion 1002c. Also, when necessary, at least one light source may be arranged on the second planar portion 1002c.

An angled formed by the inclined portion 1002b with the first planar portion 1002a may be appropriately controlled to be within a range of between 0° to 90°. The circuit substrate 1002 may have the above-described structure so that the optical sheet 3020 may maintain uniform brightness even in an edge portion thereof.

The optical sheet 3020 may be provided on the light-emitting module 3010 and include a diffusion sheet 3021, a condensing sheet 3022, and a protection sheet 3023. That is, the diffusion sheet 3021, the condensing sheet 3022, and the protection sheet 3023 may be sequentially prepared on the light-emitting module 3010. The diffusion sheet 3021 may diffuse light emitted by the light-emitting module 3010, the condensing sheet 3022 may condense the light diffused by the diffusion sheet 3021 and increase luminance of the light-emitting module 3010, and the protection sheet 3023 may protect the condensing sheet 3022 and ensure a view angle of the light-emitting module 3010.

The upper cover 3040 may enclose an edge of the optical sheet 3020 and be assembled with the lower cover 3005.

The LC panel 3030 may be further provided between the optical sheet 3020 and the upper cover 3040. The LC panel 3030 may include a pair of a first substrate (not shown) and a second substrate (not shown), which may be bonded to each other with an LC layer therebetween. A plurality of gate lines may intersect a plurality of data lines to define pixel regions on the first substrate. Thin-film transistors (TFTs) may be respectively provided at intersections between the pixel regions, and may correspond one-to-one to and be connected to pixel electrodes mounted on the respective pixel regions. The second substrate may include red (R), green (G), and blue (B) color filters respectively corresponding to the pixel regions and a black matrix covering edges of the respective color filters, the gate lines, the data lines, and the TFTs.

Figure 14:
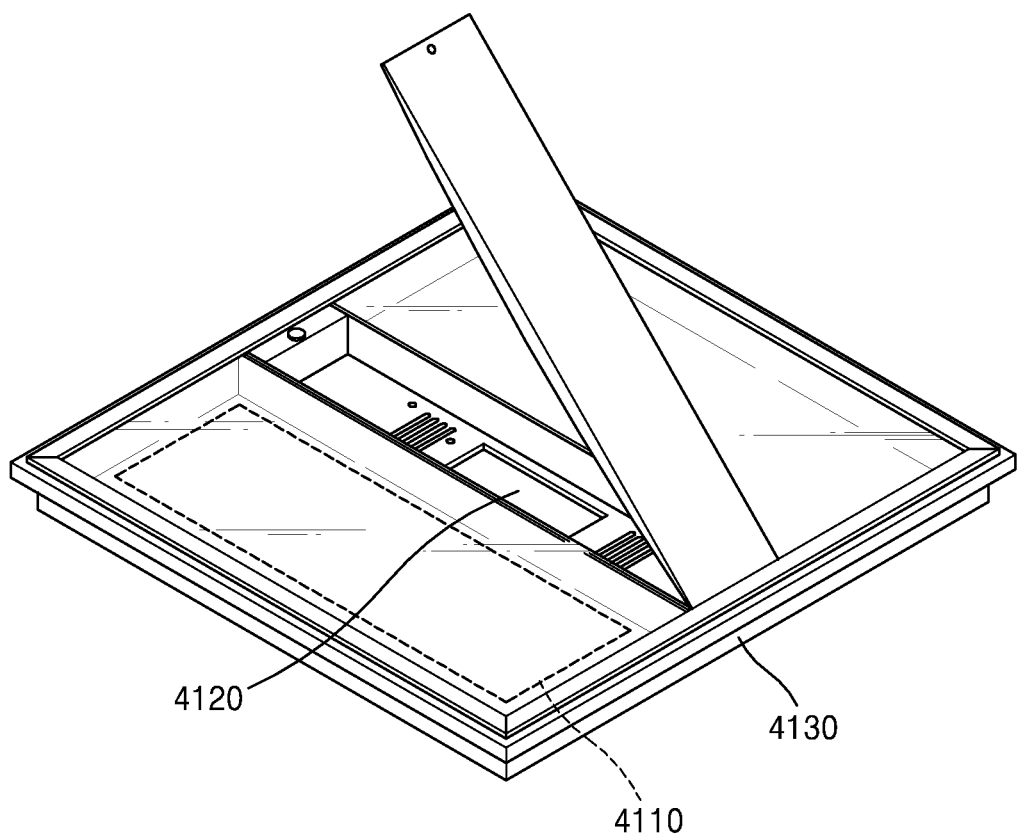
FIG. 14 is a schematic diagram of a flat-panel illumination system including a light-emitting device array unit and a light-emitting device module in which a light-emitting device package fabricated using a method of fabricating a light-emitting device package, according to exemplary embodiments of the inventive concept, is arranged.

FIG. 14 is a schematic diagram of a flat-panel illumination system 4100 including a light-emitting device array unit and a light-emitting device module in which a light-emitting device package fabricated using a method of fabricating a light-emitting device package, according to exemplary embodiments of the inventive concept, is arranged.

Referring to FIG. 14, the flat-panel illumination system 4100 may include a light source 4110, a power supply device 4120, and a housing 4130. The light source 4110 may include a light-emitting device array unit including a light-emitting device package according to exemplary embodiments of the inventive concept.

The light source 4110 may include the light-emitting device array unit and have an overall plane shape as shown in FIG. 14.

The power supply device 4120 may be configured to supply power to the light source 4110.

The housing 4130 may include an accommodation space in which the light source 4110 and the power supply device 4120 are accommodated, and have a hexahedral shape having one open side surface, but the present exemplary embodiment is not limited thereto. The light source 4110 may be disposed to emit light toward the open side surface of the housing 4130.

Figure 15:
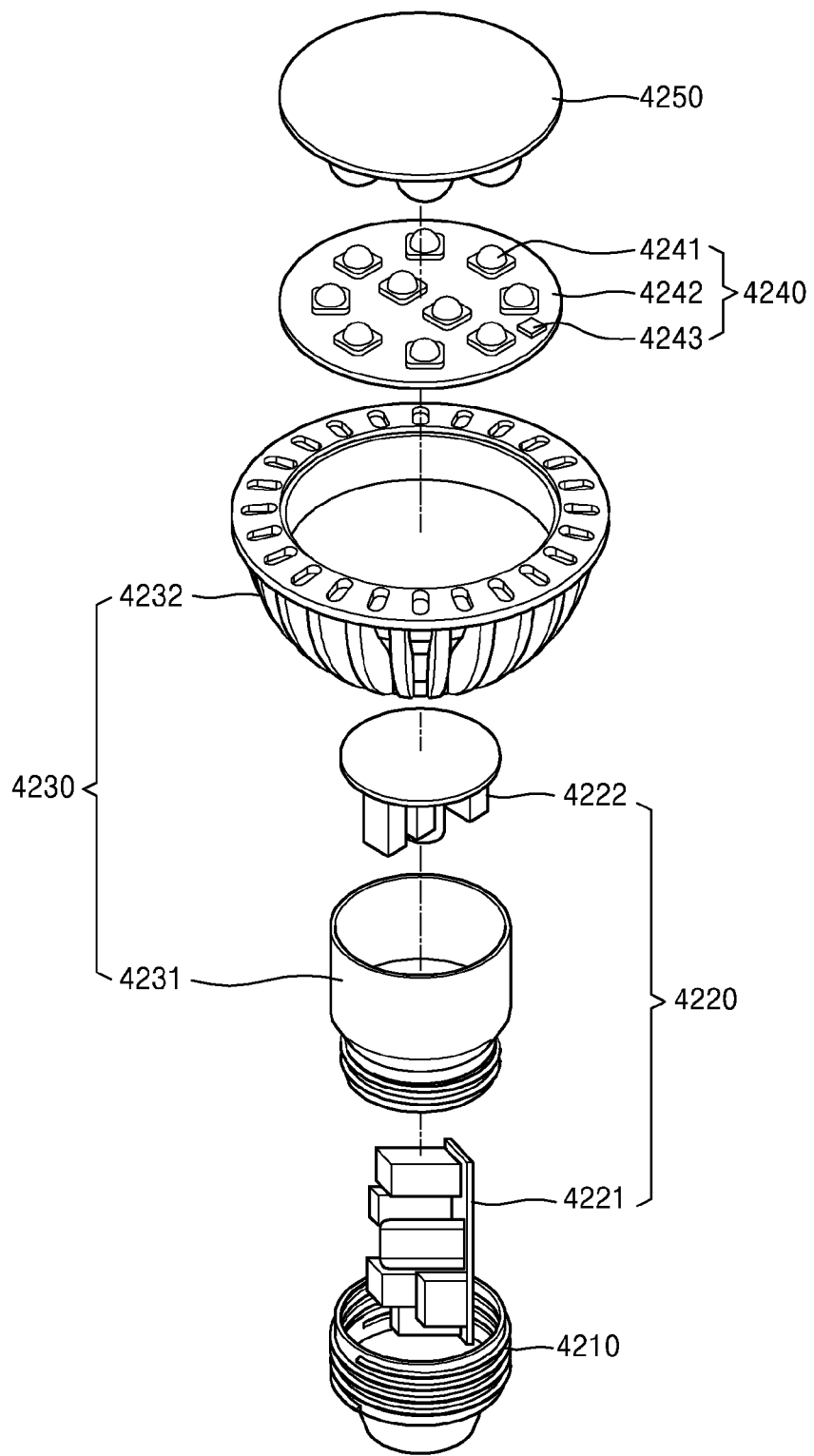
FIG. 15 is a schematic diagram of a bulb-type lamp, which is an illumination system including a light-emitting device array unit and a light-emitting device module in which an LED chip fabricated using a method of fabricating an LED chip according to an exemplary embodiment of the inventive concept is arranged.

FIG. 15 is a schematic diagram of a bulb-type lamp, which is an illumination system 4200 including a light-emitting device array unit and a light-emitting device module in which an LED chip fabricated using a method of fabricating an LED chip according to an exemplary embodiment of the inventive concept is arranged.

Referring to FIG. 15, the illumination system 4200 may include a socket 4210, a power source unit 4220, a radiation unit 4230, a light source 4240, and an optical unit 4250. According to an exemplary embodiment, the light source 4240 may include a light-emitting device array unit including a light-emitting device package according to an exemplary embodiment of the inventive concept.

The socket 4210 may be configured to be capable of being replaced by an illumination system of the related art. Power supplied to the illumination system 4200 may be applied through the socket 4210. As shown in FIG. 15, the power source unit 4220 may be formed by assembling a first power source unit 4221 and a second power source unit 4222.

The radiation unit 4230 may include an internal radiation unit 4231 and an external radiation unit 4232. The internal radiation unit 4131 may be directly connected to the light source 4240 and/or the power source unit 4220 so that heat may be transmitted to the external radiation unit 4232. The optical unit 4250 may include an internal optical unit (not shown) and an external optical unit (not shown) and may be configured to uniformly disperse light emitted by the light source 4240.

The light source 4240 may receive power from the power source unit 4220 and emit light to the optical unit 4250. The light source 4240 may include a light-emitting device array unit, according to one of the exemplary embodiments. The light source 4240 may include at least one light-emitting device package 4241, a circuit substrate 4242, and a rank information storage unit 4243, and the rank information storage unit 4243 may store rank information of light-emitting device packages 4241.

A plurality of light-emitting device packages 4241 included in the light source 4240 may be of the same kind to generate light having the same wavelength. Alternatively, the plurality of light-emitting device packages 4241 included in the light source 4240 may be of different kinds to generate light having different wavelengths. For example, the light-emitting device package 4241 may include a blue light-emitting device, a white light-emitting device manufactured by combining yellow, green, red, or orange phosphors, and at least one of violet, blue, green, red, or infrared (IR) light-emitting devices so as to control a color temperature of light and a color rendering index (CRI). Alternatively, when an LED chip emits blue light, a light-emitting device package including at least one of yellow, green, and red phosphors may be configured to emit white light having various color temperatures according to a combination ratio of the phosphors. Alternatively, a light-emitting device package in which a green or red phosphor is applied to the blue LED chip may be configured to emit green or red light. The light-emitting device package configured to emit white light may be combined with the light-emitting device package configured to emit green or red light so as to control a color temperature and CRI of white light. Also, the light-emitting device package 4241 may include at least one of light-emitting devices configured to emit violet, blue, green, red, or IR light. In this case, the illumination system 4200 may control CRI in sodium (Na) to the level of sunlight, and generate various white light beams at a color temperature of about 1500K to about 20000K. When necessary, the illumination system 4200 may generate violet, blue, green, red, or orange visible light or IR light and control color of illumination according to an ambient atmosphere or mood. Also, the illumination system 4200 may generate light having a specific wavelength to facilitate growth of plants.

Figure 16:
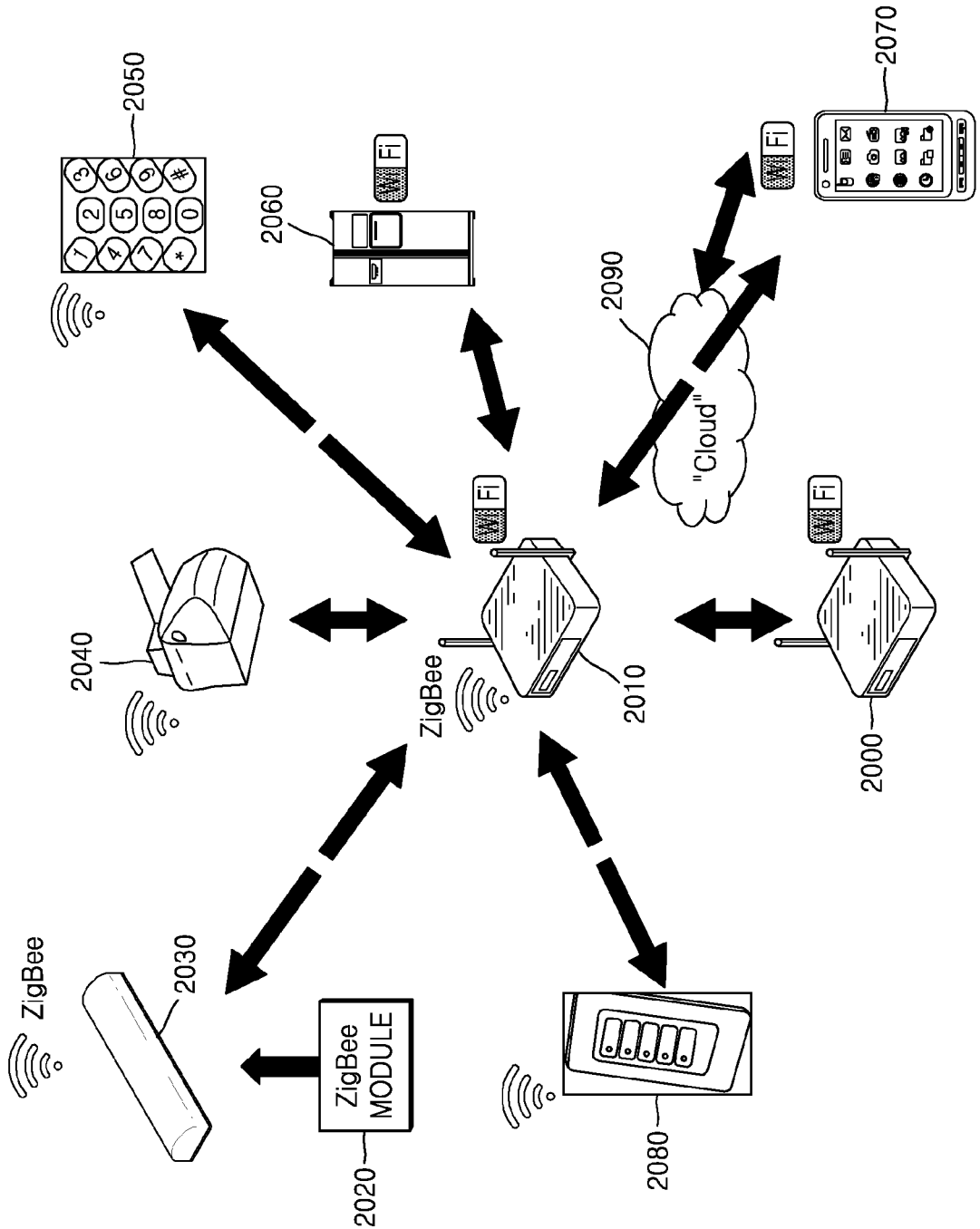
FIGS. 16 and 17 are schematic diagrams of examples of a home network to which an illumination system including a light-emitting device package according to an exemplary embodiment of the inventive concept is applied.
Figure 17:
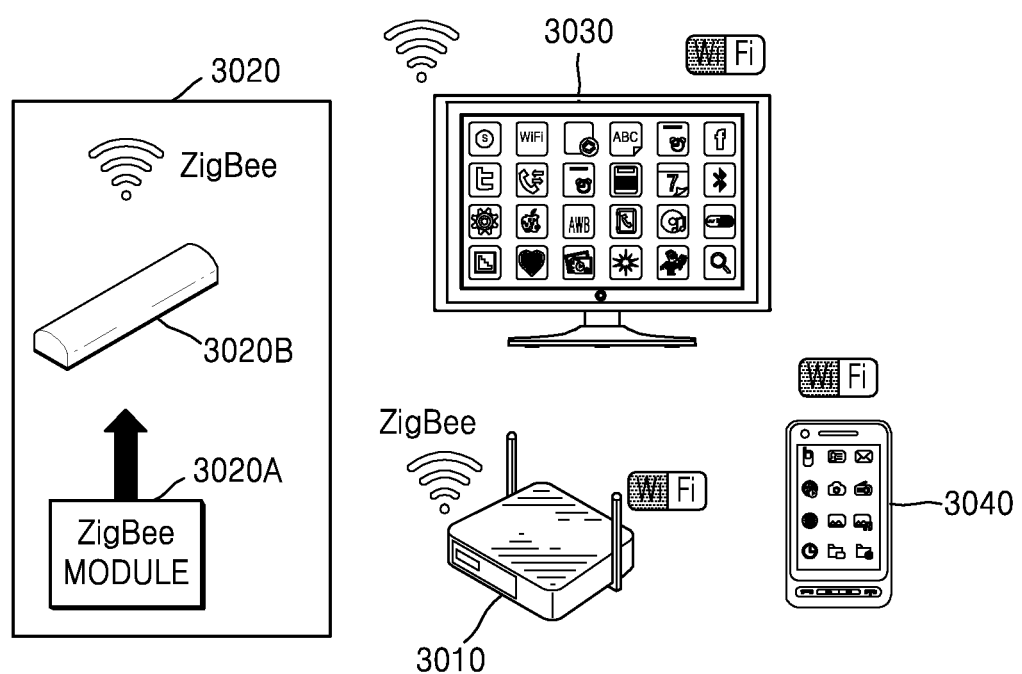

FIGS. 16 and 17 are schematic diagrams of examples of a home-network to which an illumination system including a light-emitting device package according to an exemplary embodiment of the inventive concept is applied.

As shown in FIG. 16, the home network may include a home wireless router 2000, a gateway hub 2010, a ZigBee module 2020, an LED lamp 2030, a garage door lock 2040, a wireless door lock 2050, a home application 2060, a cell phone 2070, a wall-mounted switch 2080, and a cloud network 2090.

The home-network may automatically control brightness of the LED lamp 2030 using household wireless communications (e.g., ZigBee and WiFi) depending on operation states of a bedroom, a living room, a front door, a storage closet, and household appliances and ambient environments and statuses.

For example, as shown in FIG. 17, the brightness of an LED lamp 3020B may be automatically controlled using a gateway or router 3010 and a ZigBee module 3020A depending on the type of a TV program viewed on a TV 3030 or the brightness of a screen of the TV 3030. When a drama is shown on the TV 3030 and a cozy atmosphere is needed, the impression of colors may be controlled such that a color temperature of the LED lamp 3020B may be reduced to a range of about 2000K to about 5000K or to about 12000K or lower. In contrast, when a comedy program is shown in a light-hearted atmosphere, a color temperature of the LED lamp 3020B may be increased to a range of about 4000K to 7000K or to about 12000K or higher, and the LED lamp 3020B may be controlled in bluish white colors.

The ZigBee module 2020 or 3020A may be unified with an optical sensor and form a module. For example, the ZigBee module 2020 or 3020A may be unified with a light source 4240 of the illumination system 4200.

Visible-light wireless communication technology may wirelessly transmit information by using light having a visible wavelength range, which is visible to the human eyes. The visible-light wireless communication technology may be distinguished from wired optical communication technology and infrared (IR) wireless communication of the related art in that light having a visible wavelength range is used. Also, the visible-light wireless communication technology may be distinguished from wired optical communication technology of the related art in that a wireless communication environment is used. Also, unlike radio-frequency (RF) wireless communication, the visible-light wireless communication technology may be excellent in convenience and physical security because frequencies may be freely used without regulation or permission. Furthermore, the visible-light wireless communication technology may be unique because a user may see a communication link with the eyes. Most of all, the visible-light wireless communication technology may be characterized as convergence technology by serving as both a light source and a communication device. Accordingly, a smart home networking system described with reference to FIGS. 16 and 17 may be embodied by using a smart light source 4240 having the visible-light wireless communication function.

In addition, an LED illumination system may be used for an internal light source or an external light source for vehicles. The LED illumination system may be used for an internal light source, such as an interior light, a reading light, or various lights for a gauge board for vehicles. Also, the LED illumination system may be used for an external light source, such as a headlight, a brake light, a direction guide light, a fog light, a running light for vehicles.

An LED using a particular wavelength range may promote growth of plants, stabilize human feelings, or cure diseases. An LED may be used as a light source for robots or various mechanical apparatuses. Since the LED has low power consumption and a long lifetime, illumination systems may be embodied by combining the LED with an eco-friendly renewable energy power system using solar cells or wind power.

While the inventive concept has been particularly shown and described with reference to exemplary embodiments thereof, it will be understood that various changes in form and details may be made therein without departing from the spirit and scope of the following claims.

What is claimed is:

1. A method of fabricating a light-emitting device package, the method comprising steps of:
    preparing a carrier including a first surface and a second surface disposed opposite the first surface;
    forming a phosphor layer on the first surface of the carrier;
    emitting first light from a test light-emitting device toward the second surface of the carrier;
    analyzing second light passing through the phosphor layer; and
    determining a thickness of the phosphor layer based on the analysis.

2. The method of claim 1, wherein the step of forming the phosphor layer comprises:
    coating the first surface of the carrier with phosphor; and
    shaping the phosphor using a mold.

3. The method of claim 2, wherein the mold includes at least one of a blade and a roller.

4. The method of claim 1, wherein the second light includes first transmitted light having a wavelength range substantially the same as a wavelength range of the first light and second transmitted light having a wavelength range different from the wavelength range of the first light,
    wherein the step of determining the thickness of the phosphor layer comprises calculating a ratio of luminous intensity of the second transmitted light to luminous intensity of the first transmitted light.

5. The method of claim 1, wherein the first light emitted by the test light-emitting device comprises blue light.

6. The method of claim 1, wherein the second light emitted by the phosphor layer comprises blue light and yellow light.

7. The method of claim 6, wherein the step of determining the thickness of the phosphor layer comprises:
    collecting a luminous intensity spectrum with respect to the wavelength of the second light; and
    calculating a ratio of a maximum luminous intensity of the yellow light to a maximum luminous intensity of the blue light in the luminous intensity spectrum.

8. The method of claim 7, wherein the thickness of the phosphor layer is represented by an equation:

$$d = a1 * \ln\frac{Iy}{Ib} + b1,$$

wherein d is the thickness of the phosphor layer, Iy is the maximum luminous intensity of the yellow light, Ib is the maximum luminous intensity of the blue light in the luminous intensity spectrum, and each of a1 and b1 is a constant.

9. The method of claim 6, wherein the step of determining the thickness of the phosphor layer comprises:
    collecting a luminous intensity spectrum relative to the wavelength of the second light; and
    calculating a ratio of a total amount of light in a wavelength range of yellow light to a total amount of light in a wavelength range of blue light.

10. The method of claim 9, wherein the thickness of the phosphor layer is represented by an equation:

$$d = a2 * \ln\frac{Iyt}{Ibt} + b2,$$

wherein d is the thickness of the phosphor layer, Iyt is the total amount of light in a wavelength range of the yellow light, Ibt is the total amount of light in a wavelength range of the blue light, and each of a2 and b2 is a constant.

11. A method of fabricating a light-emitting device package, the method comprising steps of:
    coating a first surface of a carrier with phosphor;
    forming a phosphor layer by shaping the phosphor using a mold;
    measuring a thickness of the phosphor layer in real-time using a test light-emitting device and a photodetector;
    determining whether the measured thickness is equal to a desired thickness; and
    controlling the thickness of the phosphor layer by adjusting the mold, according to the determination.

12. The method of claim 11, wherein the controlling of the thickness of the phosphor layer comprises adjusting a height of the mold with reference to the first surface of the carrier.

13. The method of claim 11, wherein the test light-emitting device faces a second surface disposed opposite the first surface of the carrier, and the photodetector faces the first surface of the carrier.

14. The method of claim 11, wherein the photodetector detects light that is continuously emitted by the phosphor layer during the formation of the phosphor layer.

15. The method of claim 11, wherein the photodetector detects light emitted by the phosphor layer, only for a specific time period during the formation of the phosphor layer.

16. A method of fabricating a light-emitting device package, the method comprising steps of:
    coating a first surface of a carrier with phosphor;
    moving one of a blade and the carrier with reference to another, along a direction parallel to the first surface so as to form a phosphor layer on the carrier;
    providing a test light-emitting device at a first side of the carrier and the phosphor layer so as to emit first light to the phosphor layer, and a photodetector positioned at a second side of the carrier and the phosphor layer opposite to the first side so as to collect second light originated from the test light-emitting device and converted by the phosphor layer;
    analyzing spectrum of the second light collected by the photodetector; and
    adjusting a distance between the blade and the first surface based on the analysis of spectrum.

17. The method of claim 16, wherein the second light includes first transmitted light having a wavelength range substantially the same as a wavelength range of the first light and second transmitted light having a wavelength range different from the wavelength range of the first light,
    wherein the step of analyzing the second light comprises one selected from the group consisting of determining a ratio of luminous intensity of the second transmitted light to luminous intensity of the first transmitted light, determining a ratio of a maximum luminous intensity of the second transmitted light to a maximum luminous intensity of the first transmitted light, and determining a ratio of a total amount of light in a wavelength range of the second transmitted light to a total amount of light in a wavelength range of the first transmitted light.

18. The method of claim 17, wherein the step of adjusting the distance includes:
    if the determined ratio is greater than an upper limit of a corresponding predetermined range, decreasing the distance between the blade and the first surface,
    if the determined ratio is less than a lower limit of the corresponding predetermined range, increasing the distance between the blade and the first surface, and
    if the determined ratio is within the corresponding predetermined range, maintaining the distance between the blade and the first surface.

19. The method of claim 16, further comprising steps of:
    attaching the phosphor layer to a plurality of light-emitting devices each emitting substantially the same light as the test light-emitting device; and
    singulating the phosphor layer so as to form a plurality of light-emitting device packages.

20. The method of claim 16, further comprising steps of:
    singulating the phosphor layer so as to form a plurality of singulated phosphor layers; and
    attaching one of the plurality of singulated phosphor layers to a light-emitting device emitting substantially the same light as the test light-emitting device.

* * * * *